United States Patent
Johnson et al.

[19]

[11] Patent Number: 6,030,701
[45] Date of Patent: *Feb. 29, 2000

[54] MELT-FLOWABLE MATERIALS AND METHOD OF SEALING SURFACES

[75] Inventors: Michael A. Johnson, Stillwater; Clayton A. George, Afton; Peggy S. Willett, Stillwater; Scott R. Meyer, Woodbury, all of Minn.

[73] Assignee: 3M Innovative Properties Company, St. Paul, Minn.

[*] Notice: This patent issued on a continued prosecution application filed under 37 CFR 1.53(d), and is subject to the twenty year patent term provisions of 35 U.S.C. 154(a)(2).

[21] Appl. No.: 08/716,919

[22] Filed: Sep. 20, 1996

Related U.S. Application Data

[63] Continuation of application No. 08/421,055, Apr. 12, 1995, which is a continuation-in-part of application No. 08/047,862, Apr. 15, 1993, and a continuation-in-part of application No. 08/150,692, Nov. 10, 1993.

[51] Int. Cl.⁷ .................................. B32B 7/12; B32B 3/14
[52] U.S. Cl. ....................................... 428/343; 428/355 EP; 428/355 AC; 428/480
[58] Field of Search ........................ 428/343, 354, 428/355 EP, 355 AC, 480, 458

[56] References Cited

U.S. PATENT DOCUMENTS

| | | |
|---|---|---|
| 2,015,658 | 1/1935 | Bezzenberger . |
| 2,053,360 | 12/1936 | Benner et al. . |
| 2,899,288 | 1/1959 | Barclay . |
| 3,018,262 | 1/1962 | Schroeder . |
| 3,117,099 | 1/1964 | Proops et al. . |
| 3,169,945 | 2/1965 | Hostettler et al. . |
| 3,230,672 | 1/1966 | Anthon . |
| 3,515,615 | 6/1970 | Okada . |
| 3,634,169 | 1/1972 | Garnish . |

(List continued on next page.)

FOREIGN PATENT DOCUMENTS

| | | |
|---|---|---|
| 766116 | 1/1968 | Canada . |
| 0 144 733 | 11/1983 | European Pat. Off. . |
| 0 118 044 | 9/1984 | European Pat. Off. . |
| 0 212 238 A2 | 3/1987 | European Pat. Off. . |
| 0 257 757 A2 | 3/1988 | European Pat. Off. . |
| 0 276 716 | 8/1988 | European Pat. Off. . |
| 304026 | 2/1989 | European Pat. Off. . |
| 359373 A2 | 3/1990 | European Pat. Off. . |
| 384598 A1 | 8/1990 | European Pat. Off. . |
| 0 497 451 A2 | 8/1992 | European Pat. Off. . |
| 0 587 171 A1 | 3/1994 | European Pat. Off. . |

(List continued on next page.)

OTHER PUBLICATIONS

Anderson, Robert D., "New Polymeric Materials for Joining and Fastening Applications", *Plastics in Construction*, (1992) Constructionplas Conference, McLean, VA, 20th–22nd Oct. 1992, pp. 90–94.

NEVCHEM Hydrocarbons Resins, Neville Chemical Co., pp. 3000–3002, 3056–3057, 3090, 3096–3097, 3127.

Research Disclosure No. 32608, "Self Sealing and Bonding Molding", pp. 387, Disclosed Anonymously, Jun. 1991.

Satriana, M.J., *Hot Melt Adhesives–Manufacturing and Applications*, Noyes Data Corp., Park Ridge, NJ (1974), pp. 222–225.

Teslin Synthetic Printing Sheet, Product Lit. No. 2435 0693 50M, 1993, from Teslin Products, PPG Industries, Inc., Pittsburgh, PA.

Teslin Synthetic Printing Sheet, Tags and Labels, Product Literature No. 2367C 10M 0393, 1993, from Teslin Porducts, PPG Industries, Inc., Pittsburg, PA.

NEVCHEM Hydrocarbon Resins, Neville Chemical Co., pp. 3000–3002, 3056–3057, 3090, 3096–3097, 3127.

*Primary Examiner*—Daniel Zirker
*Attorney, Agent, or Firm*—Harold C. Knecht, III

[57] ABSTRACT

The invention provides a method for imparting topographical or protective features to a substrate by contacting a sheet material comprising a thermosettable layer with a substrate and heating the sheet material to an elevated temperature.

26 Claims, 3 Drawing Sheets

U.S. PATENT DOCUMENTS

| | | |
|---|---|---|
| 3,659,896 | 5/1972 | Smith et al. .............................. 296/93 |
| 3,703,434 | 11/1972 | Schaaf . |
| 3,737,355 | 6/1973 | Epstein et al. . |
| 3,770,555 | 11/1973 | Gladstone et al. . |
| 3,784,435 | 1/1974 | Bagheri et al. . |
| 3,786,116 | 1/1974 | Milkovich . |
| 3,813,231 | 5/1974 | Gilbert et al. . |
| 3,837,984 | 9/1974 | Wagner et al. . |
| 3,842,059 | 10/1974 | Milkovich et al. . |
| 3,934,066 | 1/1976 | Murch . |
| 3,996,082 | 12/1976 | Leatherman . |
| 4,047,903 | 9/1977 | Hesse et al. . |
| 4,059,715 | 11/1977 | Pletcher . |
| 4,091,150 | 5/1978 | Roelofs . |
| 4,092,443 | 5/1978 | Green . |
| 4,120,916 | 10/1978 | Meyer, Jr. et al. . |
| 4,129,607 | 12/1978 | Kooi et al. . |
| 4,145,465 | 3/1979 | Sanderson et al. . |
| 4,163,647 | 8/1979 | Swiatek . |
| 4,173,476 | 11/1979 | Smith et al. . |
| 4,173,506 | 11/1979 | Pletcher . |
| 4,181,752 | 1/1980 | Martens et al. . |
| 4,199,646 | 4/1980 | Hori et al. . |
| 4,240,807 | 12/1980 | Kronzer . |
| 4,252,593 | 2/1981 | Green . |
| 4,256,828 | 3/1981 | Smith . |
| 4,311,489 | 1/1982 | Kussner . |
| 4,356,050 | 10/1982 | Crivello et al. . |
| 4,363,853 | 12/1982 | Imamura et al. . |
| 4,427,481 | 1/1984 | Smith et al. . |
| 4,436,896 | 3/1984 | Okamoto et al. . |
| 4,439,256 | 3/1984 | Meserve . |
| 4,444,806 | 4/1984 | Morgan et al. . |
| 4,490,424 | 12/1984 | Gerace . |
| 4,495,020 | 1/1985 | Nakabayashi et al. . |
| 4,578,309 | 3/1986 | Worth . |
| 4,588,419 | 5/1986 | Caul et al. . |
| 4,593,051 | 6/1986 | Koleske . |
| 4,613,233 | 9/1986 | Kan . |
| 4,622,349 | 11/1986 | Koleske et al. . |
| 4,652,275 | 3/1987 | Bloecher et al. . |
| 4,666,954 | 5/1987 | Forgo et al. . |
| 4,693,775 | 9/1987 | Harrison et al. . |
| 4,746,713 | 5/1988 | Janowicz . |
| 4,751,138 | 6/1988 | Tumey et al. . |
| 4,769,283 | 9/1988 | Sipinen et al. . |
| 4,775,719 | 10/1988 | Markevka et al. . |
| 4,799,939 | 1/1989 | Bloecher et al. . |
| 4,812,488 | 3/1989 | Koleske et al. . |
| 4,822,683 | 4/1989 | Schappert et al. . |
| 4,857,396 | 8/1989 | Otonari et al. . |
| 4,861,644 | 8/1989 | Young et al. . |
| 4,891,269 | 1/1990 | Markevka et al. . |
| 4,898,630 | 2/1990 | Kitoh et al. . |
| 4,900,771 | 2/1990 | Gerace et al. . |
| 4,903,440 | 2/1990 | Larson et al. . |
| 4,906,501 | 3/1990 | Honma et al. . |
| 4,920,182 | 4/1990 | Manser et al. . |
| 4,927,431 | 5/1990 | Buchanan et al. . |
| 4,933,219 | 6/1990 | Sakumoto et al. . |
| 4,966,609 | 10/1990 | Callinan et al. . |
| 4,985,535 | 1/1991 | Takado et al. . |
| 4,996,283 | 2/1991 | Greco et al. . |
| 4,997,717 | 3/1991 | Rembold et al. . |
| 5,021,507 | 6/1991 | Stanley et al. . |
| 5,028,677 | 7/1991 | Janowicz . |
| 5,032,209 | 7/1991 | Shinbach et al. . |
| 5,032,450 | 7/1991 | Rechlicz et al. . |
| 5,045,302 | 9/1991 | Kelly et al. . |
| 5,045,393 | 9/1991 | Kumanoya et al. . |
| 5,086,088 | 2/1992 | Kitano et al. . |
| 5,087,491 | 2/1992 | Barrett . |
| 5,089,536 | 2/1992 | Palazzotto . |
| 5,126,188 | 6/1992 | Shimizu et al. . |
| 5,151,327 | 9/1992 | Nishiyama et al. . |
| 5,262,481 | 11/1993 | Jammet . |
| 5,264,530 | 11/1993 | Darmon et al. . |
| 5,290,633 | 3/1994 | Devlin et al. . |
| 5,310,807 | 5/1994 | Antonelli et al. . |
| 5,326,605 | 7/1994 | Ono et al. . |
| 5,346,766 | 9/1994 | Otter et al. . |
| 5,411,351 | 5/1995 | Lasch et al. . |
| 5,436,063 | 7/1995 | Follett et al. . |
| 5,443,903 | 8/1995 | Hansen . |

FOREIGN PATENT DOCUMENTS

| | | |
|---|---|---|
| 2117370 | 7/1972 | France . |
| 53-42280 | 4/1978 | Japan . |
| A-57-164 179 | 8/1982 | Japan . |
| A-05 186 755 | 7/1983 | Japan . |
| A-60-228 527 | 11/1985 | Japan . |
| 1067417 | 3/1989 | Japan . |
| 64-67417 | 3/1989 | Japan . |
| 1-152049 | 4/1989 | Japan . |
| 1-98660 | 4/1989 | Japan . |
| 1268776 | 10/1989 | Japan . |
| A-02-239447 | 9/1990 | Japan . |
| A-4153285 | 5/1992 | Japan . |
| 4189885 | 7/1992 | Japan . |
| H4-189885 | 7/1992 | Japan . |
| A-04292941 | 10/1992 | Japan . |
| 51 11973 | 5/1993 | Japan . |
| 2164899 | 4/1986 | United Kingdom . |
| 2165910 | 4/1986 | United Kingdom . |
| WO 92/08073 | 5/1992 | WIPO . |
| WO 92/20754 | 11/1992 | WIPO . |
| WO 93/09195 | 5/1993 | WIPO . |
| WO 93/24279 | 12/1993 | WIPO . |
| WO 94/05338 | 3/1994 | WIPO . |
| WO 94/21741 | 9/1994 | WIPO . |

MELT-FLOWABLE MATERIALS AND METHOD OF SEALING SURFACES

This application is a continuation of application No. 08/421,055, filed on Apr. 12, 1995, which is a continuation-in-part of U.S. Ser. No. 08/047,862, filed Apr. 15, 1993, pending and U.S. Ser. No. 08/150,692, filed Nov. 10, 1993, now abandoned, the contents of each of which are hereby incorporated by reference.

FIELD OF THE INVENTION

The present invention relates to a method of using a melt-flowable sheet material to provide protective and aesthetic features to a surface.

BACKGROUND OF THE INVENTION

Numerous applications exist in industry where it is desirable and necessary in some cases to provide protective and/or aesthetic features to a surface. Such applications include use of a paintable sealer for automobile bodies. Historically, a variety of materials have been used as sealers to fill voids in structures and exclude dirt, moisture, and other materials.

Sealers have been supplied as liquids or solids depending upon the demands of the application. In the automotive industry, paste-like plastisols have been used for decades to seal metal seams, as described in U.S. Pat. No. 4,900,771 (Gerace et al.). These materials function by having PVC (polyvinyl chloride) particles swell in a plasticizer when heated, and fuse into a solid material. Typically, paint adheres poorly to PVC based sealers due to the high levels of plasticizer. In addition, PVC sealers cannot be recycled, and when burned, give off HCl. For this reason they are not used in Europe.

Hot melt sealants and adhesives are generally solid thermoplastic materials which quickly melt with heating and then form a firm bond on cooling. A typical class of hot melt adhesive compositions utilizes polyolefins which are known in the art to be difficult to paint and which have poor adhesion to non-porous metallic surfaces, such as steel and aluminum.

In use, a bead of the liquid sealer is applied on the joint seam, in the way caulking is applied, and the worker must brush or level the material out into a relatively uniform film. The application of a liquid sealer takes skill and often results in a poorly sealed seam. Liquid sealers cannot be used for visible applications due to non-uniform appearance.

Recently there has been a trend towards more user-friendly sealer systems such as ropes or tapes because the handling properties of these materials make for fast installation and eliminate the need to finesse the material after application. Tapes and ropes of PVC-based sealant material have begun to find niche applications. Other materials have also been supplied as a strip or tape.

U.S. Pat. No. 3,659,896 (Smith et al.) describes a semi-cured, curable polymeric sealing strip composition based on a liquid polysulfide polymer, for adhering and sealing a windshield to an automobile body. The sealing strip has adhesion to both the glass and metal such that the windshield is immediately sealed at room temperature; further cure of the sealant material occurs on exposure to moisture at ambient conditions.

U.S. Pat. No. 4,490,424 (Gerace) describes a hot-melt adhesive and sealant tape in which the tape comprises a core of hot-melt adhesive encased in a sheath of plastic resin. The plastic resin is compatible with the hot-melt adhesive core in both liquid and solid states.

A need exists in industry for a user-friendly, paintable, meltable sealant material that can be used for visible and non-visible applications and handled as a strip or tape.

Thermosettable pressure-sensitive adhesives are known and have utility in a number of industries including assembly of automobiles and appliances. Such adhesives are described in U.S. Pat. No. 5,086,088 (Kitano et al.). These adhesives are pressure-sensitive, i.e., tacky at the temperature of bonding, and are typically used in the form of a pressure-sensitive adhesive transfer tape in which the layer of adhesive is provided on a release liner. The transfer tape can further include a nonwoven web for reinforcement of the adhesive layer. In use, the transfer tape bonds one surface to another surface at ambient temperature. The surfaces are then heated to a temperature sufficient to cure the adhesive to a thermoset state.

In some applications it would be desirable to have a thermosettable pressure-sensitive adhesive tape that has a non-tacky surface that can be activated to an adhesive state at the temperature of use.

One such application is in some automotive assembly lines where the doors are temporarily attached to the vehicle body by bolting the hinges on to the body prior to painting. The door is positioned on the vehicle by aligning the door hinges on slotted holes in the car body, and then fastening the hinges to the body with one or more washers and corresponding bolts. After the vehicle body has been painted, the doors are removed from the hinges so that interior parts can be installed. It would be desirable to have the washers fixed in place on the hinges so that when the doors are re-attached, they will be precisely aligned without having to take time to re-align them.

Japanese Patent Publication (Kokai) No. 64-67417 describes a washer fixed to a door hinge with a tacky thermosetting adhesive film. The washer serves as an alignment member for a bolt that is used to join the hinge to a door. The film is tacky on both sides and is prone to contamination from dust, oil, etc., which can be found in assembly plants. The contaminated surface, in turn, must be cleaned to ensure an adequate bond. The film also tends to be very thin so that it can be difficult to handle, and removing the liners so that the film can be bonded to the washers and the bolted surfaces can be a labor intensive operation which prohibits automation of the assembly line.

It is known to saturate a nonwoven fabric as a support with a thermosettable adhesive to increase the rigidity of the adhesive so that it can be handled more easily, but this would add cost and does not get around the other deficiencies of the above-described adhesive film.

Japanese Patent Publication (Kokai) No. 53-42280 describes a composite sheet having a sheet of thermosetting material that is coated with a heat fusing material. The heat fusing material is intended to coat the thermosetting resin sheet so that workers can avoid direct skin contact with the thermosetting adhesive. The thermosetting material and the heat fusing material are mutually non-reactive and compatible, and characterized by a maximum difference in fusing temperatures of 50° C. The heat fusing material melts and mixes with the thermosetting material before it is hardened.

Japanese Laid-Open Patent Application JP H4-189885 describes a thermosettable pressure-sensitive adhesive made from acrylate copolymers and epoxy resin. The adhesive composition can be coated onto one or both sides of a nonwoven material, which acts as a pre-preg to increase the strength of the adhesive sheet.

It would be desirable to have a thermosettable pressure-sensitive adhesive tape that is substantially tack-free at room temperature (about 21° C.) on at least one major surface, but both major surfaces of the tape can be adapted for bonding to other substrates.

SUMMARY OF THE INVENTION

The invention provides an adhesive composite comprising a layer of thermosettable pressure-sensitive adhesive and a layer of hot melt adhesive that is substantially tack-free at room temperature. Preferably, the hot melt adhesive has a heat activation temperature of from about 50° C. to the temperature used to cure the thermosettable adhesive.

The invention also provides an adhesive composite for bonding to a washer which will bond to the washer at ambient temperature, and for further bonding of the washer to a surface after a heating cycle, and a washer bonded with the composite.

The invention also provides a method for bonding the composite to washers.

The invention further provides a hot melt sealing tape and a method for using the tape.

Additional features and advantages of the invention will be set forth in the description which follows, and in part will be apparent from the description, or may be learned by practice of the invention. The objectives and other advantages of the invention will be realized and attained by the methods and articles particularly pointed out in the written description and claims hereof.

It is to be understood that both the foregoing general description and the following detailed description are exemplary and explanatory and are intended to provide further explanation of the invention as claimed.

BRIEF DESCRIPTION OF THE DRAWINGS

The invention will now be described in greater detail with reference to the accompanying drawings, in which:

FIG. 4b is a cross-sectional view along the line 4b of FIG. 4a.

DETAILED DESCRIPTION OF THE INVENTION

Figure 1A:
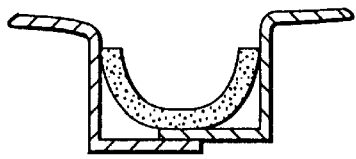
FIG. 1a is a cross-sectional view showing a sheet material according to the invention situated in an automobile roof ditch prior to heating.

The present invention comprises the use of a melt-flowable sheet material to provide protective and/or aesthetically pleasing features to a substrate. Generally, the method of the invention includes placing a melt-flowable sheet material over the substrate and heating the sheet material to cause sufficient softening of the sheet material so that it bonds to the substrate. When the melt-flowable sheet is placed on the substrate at room temperature, it is substantially tack-free. As the sheet is heated, it first softens and conforms to the surface of the substrate, thereby allowing trapped air to be pushed out by the flowing material. Further into the heating cycle, as the sheet material becomes hotter, it becomes tacky, and wets out sufficiently on the surface to bond to the surface. In some applications, the sheet material will also melt and flow to conceal defects, surface imperfections, and/or fill in gaps.

After the sheet has been bonded to the surface, the sheet material may remain melt-flowable, i.e., thermoplastic, wherein re-heating will cause the material to flow again; the sheet material may cure or cross-link when it is heated and become thermoset so that it no longer flows when re-heated; or a portion of the sheet material may cure or become cross-linked, i.e., thermoset, while a portion of the sheet material remains thermoplastic.

The method of the present invention has a number of applications in industry. One utility of the method is in the automotive industry where it can be utilized in a process to seal metal joints in automobiles. By this process, one first prepares the sheet material such as by the above-described process. Subsequently, the sheet material would be applied over the joint to be sealed. Complete sealing and bonding would be obtained because the sheet material flows prior to hardening. As a result of the controlled flow of the edges of the sheet material, an aesthetic surface appearance is achieved. The exposed surface of the hardened sheet material can then be painted or otherwise decorated to match the automobile body.

An alternative application of the method of the invention is in the application of emblems or insignia or design elements to surfaces such as an automobile body. An example of an emblem or insignia is a logo of an automobile manufacturer. An example of a design element is trim to enhance and highlight auto body curvature and to provide protection to the primed metal substructure without the need for complex metal stamping to obtain the shape. In such a method, the sheet material is configured initially in the shape of the emblem or insignia or design elements desired such as by die-cutting. Practice of the method of the invention thereby provides an aesthetically pleasing emblem or insignia having smooth transition lines relative to the surface to which it has been bonded.

In still another application of the method of the invention, the substrate to which the sheet material is initially adhered is a temporary substrate such as a disposable liner. Subsequent to hardening of the sheet material in a fashion to provide the controlled flow of its edges, the hardened sheet material may be fastened (e.g., adhered) to the permanent substrate through the use, for example, of an adhesive system distinct from the sheet material itself since the hardened sheet material may be substantially devoid of pressure-sensitive adhesive properties. In this manner, the method of the invention may be used to apply configured, hardened sheet materials such as signs to surfaces such as wooden doors.

The melt-flowable sheet material can be placed in a roof ditch on an automobile before it is painted to conceal unsightly flaws in the metal, spot welds, and the step joint where the sheet metal of the roof is welded to the sheet metal of the car body.

In one specific embodiment, the melt-flowable sheet material is cut into a strip having a width slightly greater than the width of the roof ditch and a length equal to the length of the ditch. The roof ditch may be unprimed, unprimed with a portion sealed with conventional sealers, primed with conventional primers, or primed and painted. Typically, the automobile would be primed with an electrodeposition coating as detailed hereinbelow prior to application of the strip. The strip is then heated in the ditch so the strip material flows and levels out over any imperfections and the step joint in the roof ditch creating a smooth, aesthetically pleasing appearance within the ditch. At the same time, the melt-flowable strip also adheres to the inside surfaces of the roof ditch and provides a protective seal in the ditch to prevent rain water, dirt, snow, etc. from getting into the roof ditch and causing rusting or corrosion. In this application, in which the strip has a width slightly greater than the width of the roof ditch, the strip material also takes on a concave configuration along the length of the roof ditch to provide a channel to carry water off the roof of the car.

The strip material is preferably compatible with the paint and allows the paint to dry and cure without wrinkling or cracking of the paint, while bonding tightly to both the paint and the surfaces of the roof ditch.

The automobile, with the strip in place, may then be painted and put through an oven cure cycle at about 170° C. for about 20 minutes. A protective clear coat may also be applied and cured. It is recognized that the oven cure times and temperatures will vary depending upon the paint line, and the paint and clear coat cure requirements. Typical cycles can range from about 20 to 40 minutes at temperatures between about 120° C. and 200° C.

In a preferred embodiment, the paint also reacts chemically with the melt-flowable strip material to improve the adhesion between the paint and the melt-flowable strip. The reaction of the paint with the strip material causes the strip material to become thermoset at, and near, the interface of the strip with the paint, while the strip material remains thermoplastic below the interfacial layer.

In another preferred embodiment, the melt-flowable strip itself is a thermosettable material which reacts with the paint during the cure cycle, and also undergoes curing to provide a strip that is thermoset. The curing may be achieved by thermal or radiation means as is discussed hereinbelow.

In an alternative embodiment, the strip may be placed in the roof ditch after the automobile has been painted. The roof ditch area can then be heated with conventional heaters, such as an infrared heater or a quartz halogen lamp, to melt and bond the strip to the roof ditch without further processing. In this embodiment, the strip may be compounded with pigments to provide a contrasting or complementary color. The melt sealing strip material may remain thermoplastic, become thermoset throughout the thickness of the strip, or become thermoset only at the surface of the strip.

The melt-flowable sheet materials are preferably solid, and may or may not be tacky at room temperature. In some embodiments, the melt sealing sheet material will also function as a hot melt adhesive. Hot melt adhesive materials preferably have a melting point above about 50° C. As used herein, a "hot melt adhesive composition" refers to a composition that is solid and non-tacky at room temperature (about 21° C.) but which, upon heating, melts sufficiently to wet out on a surface and adhere to it. Adhesives having melt temperatures below 50° C. may melt prematurely in storage in hot climates and may not perform well in applications that require a part to be die-cut or punched out on a punch-press as described below.

The sheet material may be formed into a sheet using conventional sheet forming techniques, including extruding the material from a heated die; heating the sheet material to a suitable melt temperature and knife coating onto a release liner; curtain coating the molten material; or dispersing the material in a solvent, coating onto a release liner, and drying the solvent. For environmental reasons, the preferred methods are solvent free systems.

The thickness of the melt-flowable sheet material will vary depending upon its intended end use. For sealing applications, it is desirable to have the sheet thick enough to provide sufficient material to flow and level out over dents, bumps, and other surface imperfections or to fill in gaps between joints. Useful thicknesses have been found to be in the range of about 0.05 mm (millimeters) to 25 mm. For typical melt sealing applications where a protective seal is desired, thicknesses may range from 0.10 to 25 mm, preferably 0.20 to 10 mm, and more preferably 0.34 to 6 mm.

The melt-flowable sheet material can be packaged in the form of rolls of sheet material, rolls of tapes, i.e., lengths of material in narrow widths, or stacks of sheets cut to a desired dimension or shape for the end use. If the compositions of the melt-flowable sheet material are tacky, a release liner may be interleaved between adjacent sheets or wraps of a roll. In some two layer sheet constructions in which one layer is tacky, the non-tacky layer may serve as the liner without requiring a separate liner. If the sheet material includes a latent light activated catalyst in the sheet, the sheet is preferably packaged and transported in the absence of actinic radiation, until ready for use.

The compositions for the melt-flowable sheet material can also be packaged for use in a hot-melt applicator system with the use of pail unloaders, cartridge dispensers, and the like. The compositions can then be heated at the point of use and applied in the molten state to the substrate. This method may require specialized equipment to apply the composition.

The melt-flowable materials can be applied and bonded to most substrates including plastics, metals, ceramics, glass, and cellulosic materials; primed, bare, or painted metal substrates such as aluminum, cold rolled steel, galvanized steel, and porcelainized steel are particularly preferred.

The melt-flowable sheet can include one or more other layers for various purposes as detailed hereinbelow. Such layers include a thermosettable melt sealing layer, a thermosettable pressure-sensitive adhesive layer, a pressure-sensitive adhesive layer, a second melt-flowable layer, e.g., one having a different glass transition temperature than the first melt-flowable layer, a layer capable of cross-linking with the melt-flowable layer at the interface between the two layers, an expandable layer, a nonwoven layer, or a polymeric film, e.g., a thermoplastic film that is preferably dimensionally stable at the temperatures of application and use. Various methods of bonding the additional layers to the melt-flowable layer include techniques known in industry such as heat lamination, bonding with a pressure-sensitive adhesive, co-extruding the second layer with the melt-flowable layer, hot melt coating, direct coating of the second layer to the first, and the like.

The melt-flowable sheet material useful in the practice of the invention comprises thermoplastic polymeric materials that have functional groups that can react with typical paints used in the industry such as those based on melamine or epoxy.

Preferred thermoplastic polymers are functionalized amorphous or semi-crystalline polymers having a glass transition temperature above −30° C. and functionalized semi-crystalline polymers having a glass transition temperature below −30° C. Useful polymers are those having functional groups including —OH, —NH, —CONH, —COOH, —NH$_2$, —SH, anhydrides, urethanes, and oxirane. Preferred functional groups are —OH, —COOH, and —NH. Examples of useful polymers include polyesters, polyamides, functionalized ethylene (meth)acrylates, such as those functionalized with —OH groups, ethylene acrylic acids, polysulfides, polyacetals, such as polyvinylbutyral, olefinic polymers having the appropriate functional groups, such as ethylene-(meth)acrylic acid, propylene-(meth)acrylic acid, ethylene-(meth)acrylic ester, propylene-(meth)acrylic ester, polycaprolactones, epoxy polycaprolactone compositions, and epoxy polyester hot melt compositions described in the parent application, U.S. Ser. No. 08/047,862, filed Apr. 15, 1993, and compatible blends thereof.

Preferred materials for the melt-flowable sheet material include polycaprolactones, and polyesters having hydroxyl and carboxyl termination and may be amorphous or semi-crystalline at room temperature. More preferred are hydroxyl terminated polyesters that are semi-crystalline at room temperature. A material that is "amorphous" has a glass transition temperature but does not display a measurable crystalline melting point as determined on a differential scanning calorimeter (DSC). Preferably, the glass transition temperature is less than the decomposition temperature of a photoinitiator, if one is used as described hereinbelow, but without being more than about 120° C. A material that is "semi-crystalline" displays a crystalline melting point as determined by DSC, preferably with a maximum melting point of about 200° C.

Crystallinity in a polymer is also observed as a clouding or opacifying of a sheet that had been heated to an amorphous state as it cools. When the polyester polymer is heated to a molten state and knife coated onto a liner to form a sheet, it is amorphous and the sheet is observed to be clear and fairly transparent to light. As the polymer in the sheet material cools, crystalline domains form and the crystallization is characterized by the clouding of the sheet to a translucent or opaque state. The degree of crystallinity may be varied in the polymers by mixing in any compatible combination of amorphous polymers and semi-crystalline polymers having varying degrees of crystallinity. It is generally preferred that material heated to an amorphous state be allowed sufficient time to return to its semi-crystalline state before painting so that the paint is applied to a uniformly consistent surface. The clouding of the sheet provides a convenient non-destructive method of determining that crystallization has occurred to some degree in the polymer.

The polymers may include nucleating agents to increase the rate of crystallization at a given temperature. Useful nucleating agents include microcrystalline waxes. A suitable wax is one comprising C greater than 14 (CAS #71770-71-5) alcohol and an ethylene homopolymer (CAS #9002-88-4) sold by Petrolite Corp. as Unilin 700. Paint catalysts such as para-toluene sulfonic acid may be added to the polyester, as well as melamines to improve the adhesion of the melt-flowable layer to paint and coatings.

The preferred polyesters are solid at room temperature. Preferred polyester materials have a number average molecular weight of about 7500 to 200,000, more preferably from about 10,000 to 50,000, and most preferably, from about 15,000 to 30,000.

Polyester components useful in the invention comprise the reaction product of dicarboxylic acids (or their diester equivalents) and diols. The diacids (or diester equivalents) can be saturated aliphatic acids containing from 4 to 12 carbon atoms (including branched, unbranched, or cyclic materials having 5 to 6 carbon atoms in a ring) and/or aromatic acids containing from 8 to 15 carbon atoms. Examples of suitable aliphatic acids are succinic, glutaric, adipic, pimelic, suberic, azelaic, sebacic, 1,12-dodecanedioic, 1,4-cyclohexanedicarboxylic, 1,3-cyclopentanedicarboxylic, 2-methylsuccinic, 2-methylpentanedioic, 3-methylhexanedioic acids, and the like. Suitable aromatic acids include terephthalic acid, isophthalic acid, phthalic acid, 4,4'-benzophenone dicarboxylic acid, 4,4'-diphenylmethanedicarboxylic acid, 4,4'-diphenylthioether dicarboxylic acid, and 4,4'-diphenylamine dicarboxylic acid. Preferably the structure between the two carboxyl groups in the diacids contain only carbon and hydrogen, and more preferably, the structure is a phenylene group. Blends of the foregoing diacids may be used.

The diols include branched, unbranched, and cyclic aliphatic diols having from 2 to 12 carbon atoms. Examples of suitable diols include ethylene glycol, 1,3-propylene glycol, 1,2-propylene glycol, 1,4-butanediol, 1,3-butanediol, 1,5-pentanediol, 2-methyl-2,4-pentanediol, 1,6-hexanediol, cyclobutane-1,3-di(2'-ethanol), cyclohexane-1,4-dimethanol, 1,10-decanediol, 1,12-dodecaniediol, and neopentyl glycol. Long chain diols including poly(oxyalkylene) glycols in which the alkylene group contains from 2 to 9 carbon atoms, preferably 2 to 4 carbon atoms, may also be used. Blends of the foregoing diols may be used.

Useful, commercially available hydroxyl terminated polyester materials include various saturated linear, semi-crystalline copolyesters available from Hüls America, Inc. such as Dynapol™S1401, Dynapol™S1402, Dynapol™S1358, Dynapol™S1359, Dynapol™S1227, and Dynapol™S1229. Useful saturated, linear amorphous copolyesters available from Hüls America, Inc., include Dynapol™S1313 and Dynapol™S1430.

The foregoing polyesters may be cast into sheets by melting the polyester resin at temperatures from about 100° to 150° C. to form a molten material and knife coating onto a liner such as a silicone release coated paper. The polyester materials may further include fillers as detailed below for an epoxy polyester composition.

Sheets formed from the foregoing polyesters are particularly useful for sealing and bonding to surfaces having gaps and imperfections such as in the above described roof ditch molding on an automobile. In addition, these polyesters have been found to provide paint compatible surfaces for melamine and epoxy paints and will withstand at least two typical paint curing cycles (e.g., 20–30 minutes at 120° C., and 20–30 minutes at 200° C.). It has also been found that these polyesters, when coated with epoxy and melamine paints, will react with the paint at the interface between the melt-flowable sheet and the paint.

Also preferred for the melt-flowable sheet material are epoxy polycaprolactone compositions and epoxy polyester hot melt compositions. Polycaprolactones are biodegradable in soil. Especially preferred are epoxy polyester hot melt compositions which cure on exposure to radiation to provide high strength sealing materials having good adhesion to the substrate to which it is adhered. The epoxy-containing material contributes to the ultimate strength and heat resistance of the composition, while the polyester component allows the sheet material to conform to the substrate and provides initial adhesion to the substrate, and the photoinitiator permits the composition to cure (i.e., covalently cross-link) upon exposure to radiation. Optionally, the hot melt compositions of the invention may also include a hydroxyl-containing material to impart flexibility and toughness to the hot melt compositions. Preferred polyesters for the epoxy/polyester sheet material are those hydroxyl and carboxyl terminated functional materials described above. Especially preferred are hydroxyl terminated polyesters having some degree of crystallinity.

Epoxy-containing materials useful in the compositions of the invention are any organic compounds having at least one oxirane ring

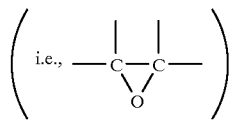

polymerizable by a ring opening reaction. Such materials, broadly called epoxides, include both monomeric and polymeric epoxides and can be aliphatic, cycloaliphatic, or aromatic. These materials generally have, on the average, at least two epoxy groups per molecule (preferably more than two epoxy groups per molecule). The "average" number of epoxy groups per molecule is defined as the number of epoxy groups in the epoxy-containing material divided by the total number of epoxy molecules present. The polymeric epoxides include linear polymers having terminal epoxy groups (e.g., a diglycidyl ether of a polyoxyalkylene glycol), polymers having skeletal oxirane units (e.g., polybutadiene polyepoxide), and polymers having pendent epoxy groups (e.g., a glycidyl methacrylate polymer or copolymer). The molecular weight of the epoxy-containing material may vary from 58 to about 100,000 or more. Mixtures of various epoxy-containing materials can also be used in the hot melt compositions of the invention.

Useful epoxy-containing materials include those which contain cyclohexene oxide groups such as the epoxycyclohexanecarboxylates, typified by 3,4-epoxycyclohexylmethyl-3,4-epoxycyclohexanecarboxylate, 3,4-epoxy-2-methylcyclohexylmethyl-3,4-epoxy-2-methylcyclohexane carboxylate, and bis(3,4-epoxy-6-methylcyclohexylmethyl) adipate. For a more detailed list of useful epoxides of this nature, reference may be made to U.S. Pat. No. 3,117,099.

Further epoxy-containing materials which are particularly useful in the practice of this invention include glycidyl ether monomers of the formula

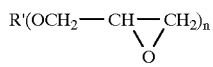

where R' is alkyl or aryl and n is an integer of 1 to 6. Examples are the glycidyl ethers of polyhydric phenols obtained by reacting a polyhydric phenol with an excess of chlorohydrin such as epichlorohydrin (e.g., the diglycidyl ether of 2,2-bis-(2,3-epoxypropoxyphenol) propane). Further examples of epoxides of this type which can be used in the practice of this invention are described in U.S. Pat. No. 3,018,262.

There is a host of commercially available epoxy-containing materials which can be used in this invention. In particular, epoxides which are readily available include octadecylene oxide, epichlorohydrin, styrene oxide, vinyl cyclohexene oxide, glycidol, glycidylmethacrylate, diglycidyl ether of Bisphenol A (e.g., those available under the trade designations EPON 828, EPON 1004, and EPON 1001F from Shell Chemical Co., and DER-332 and DER-334, from Dow Chemical Co.), diglycidyl ether of Bisphenol F (e.g., ARALDITE GY281 from Ciba-Geigy), vinylcyclohexene dioxide (e.g., ERL 4206 from Union Carbide Corp.), 3,4-epoxycyclohexylmethyl- 3,4-epoxycyclohexene carboxylate (e.g., ERL4221 from Union Carbide Corp.), 2-(3,4-epoxycylohexyl-5,5-spiro-3,4-epoxy) cyclohexanemetadioxane (e.g., ERL-4234 from Union Carbide Corp.), bis(3,4-epoxycylohexyl) adipate (e.g., ERL-4299 from Union Carbide Corp.), dipentene dioxide (e.g., ERL-4269 from Union Carbide Corp.), epoxidized polybutadiene (e.g., OXIRON 2001 from FMC Corp.), silicone resin containing epoxy functionality, epoxy silanes (e.g., beta-(3, 4-epoxycyclohexyl)ethyltrimethoxy silane and gamma-glycidoxypropyltrimethoxy silane, commercially available from Union Carbide), flame retardant epoxy resins (e.g., DER-542, a brominated bisphenol type epoxy resin available from Dow Chemical Co.), 1,4-butanediol diglycidyl ether (e.g., ARALDITE RD-2 from Ciba-Geigy), hydrogenated bisphenol A-epichlorohydrin based epoxy resins (e.g., EPONEX 1510 from Shell Chemical Co.), and polyglycidyl ether of phenolformaldehyde novolak (e.g., DEN-431 and DEN-438 from Dow Chemical Co.).

The photoinitiators which are useful in the compositions of the invention are cationic and include these three types, viz. aromatic iodonium complex salts, aromatic sulfonium complex salts and metallocene salts. Useful aromatic iodonium complex salts have the formula:

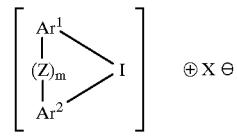

where $Ar^1$ and $Ar^2$ are aromatic groups having 4 to 20 carbon atoms and are selected from the group consisting of phenyl, thienyl, furanyl, and pyrazolyl groups. Z is selected from the group consisting of oxygen; sulfur;

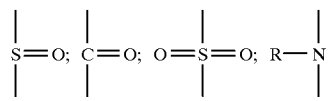

where R is aryl (of 6 to 20 carbons, such as phenyl) or acyl (of 2 to 20 carbons, such as acetyl, benzoyl, etc.); a carbon-to-carbon bond; or

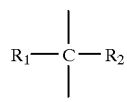

where $R_1$ and $R_2$ are selected from hydrogen, alkyl radicals of 1 to 4 carbons, and alkenyl radicals of 2 to 4 carbons. The value of m is zero or 1 and X is a halogen-containing complex anion selected from tetrafluoroborate, hexafluorophosphate, pentafluorohydroxyantimonate, hexafluoroarsenate, and hexafluoroantimonate.

The $Ar^1$ and $Ar^2$ aromatic groups may optionally have one or more fused benzo rings (e.g., naphthyl, benzothienyl, dibenzothienyl, benzofuranyl, dibenzofuranyl, etc.). The aromatic groups may also be substituted, if desired, by one or more non-basic groups if they are essentially non-reactive with epoxide and hydroxyl functionalities.

Useful aromatic iodonium complex salts are described more fully in U.S. Pat. No. 4,256,828. The preferred aromatic iodonium complex salts are diaryliodonium hexafluorophosphate and diaryliodonium hexafluoroantimonate.

The aromatic iodonium complex salts useful in the compositions of the invention are photosensitive only in the ultraviolet region of the spectrum. They, however, can be sensitized to the near ultraviolet and the visible range of the spectrum by sensitizers for known photolyzable organic halogen compounds. Illustrative sensitizers include aromatic amines and colored aromatic polycyclic hydrocarbons.

Aromatic sulfonium complex salt photoinitiators suitable for use in the compositions of the invention can be defined by the formula

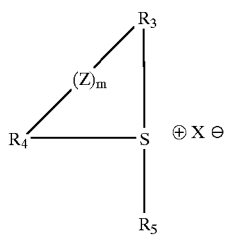

wherein $R_3$, $R_4$ and $R_5$ can be the same or different, provided that at least one of the groups is aromatic. These groups can be selected from aromatic moieties having 4 to 20 carbon atoms (e.g., substituted and unsubstituted phenyl, thienyl, and furanyl) and alkyl radicals having 1 to 20 carbon atoms. The term "alkyl" includes substituted alkyl radicals (for example, substituents such as halogen, hydroxy, alkoxy, aryl). Preferably, $R_3$, $R_4$ and $R_5$ are each aromatic. Z, m and X are all as defined above with regard to the iodonium complex salts.

If $R_3$, $R_4$ or $R_5$ is an aromatic group, it may optionally have one or more fused benzo rings (e.g., naphthyl, benzothienyl, dibenzothienyl, benzofuranyl, dibenzofuranyl, etc.) Such aromatic groups may also be substituted, if desired, by one or more non-basic groups that are essentially non-reactive with epoxide and hydroxyl functionality.

The triaryl-substituted salts such as triphenylsulfonium hexafluoroantimonate are preferred. Useful sulfonium complex salts are described more fully in U.S. Pat. No. 4,256,828.

The aromatic sulfonium complex salts useful in the invention are inherently photosensitive only in the ultraviolet region of the spectrum. They, however, are sensitized to the near ultraviolet and the visible range of the spectrum by a select group of sensitizers such as described in U.S. Pat. No. 4,256,828.

Useful metallocene salts can have the formula:

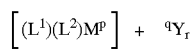

wherein
$M^P$ represents a metal selected from Cr, Mo, W, Mn, Re, Fe, and Co;
$L^1$ represents 1 or 2 ligands contributing p-electrons that can be the same or different ligand selected from substituted and unsubstituted $h^3$-allyl, $h^5$-cyclopentadienyl, and $h^7$-cycloheptatrienyl and $h^6$-aromatic compounds selected from $h^6$-benzene and substituted $h^6$-benzene compounds and compounds having 2 to 4 fused rings each capable of contributing 3 to 8 p-electrons to the valence shell of $M^P$;
$L^2$ represents none or 1 to 3 ligands contributing an even number of sigma-electrons that can be the same or different ligand selected from carbon monoxide or nitrosonium;
with the proviso that the total electronic charge contributed to $M^P$ by $L^1$ and $L^2$ plus the ionic charge on the metal $M^P$ results in a net residual positive charge of q to the complex, and
q is an integer having a value of 1 or 2, the residual electrical charge of the complex cation;
Y is a halogen-containing complex anion selected from $AsF_6-$, $SbF_6-$ and $SbF_5OH-$; and
r is an integer having a value of 1 or 2, the numbers of complex anions required to neutralize the charge q on the complex cation.

Useful metallocene salts are described more fully in U.S. Pat. No. 5,089,536 (Palazzotto et al.). An example of a useful salt is $(\eta^5$-cyclopentadienyl$)(\eta^6$-xylenes$)Fe^+SbF_6^-$, also denoted as Cp(xylenes)$Fe^+SbF_6^-$. Useful amounts of the metallocene catalyst range from about 0.05 to 20 parts by weight of the epoxy resin, preferably from about 0.07 to about 10 parts, and more preferably from about 0.09 to about 3 parts. The metallocene salts may be used in conjunction with a reaction accelerator such as an oxalate ester of a tertiary alcohol.

Useful commercially available photoinitiators include FX-512, an aromatic sulfonium complex salt (3M Company), an aromatic sulfonium complex salt (Union Carbide Corp.), UVI-6974, an aromatic sulfonium complex salt (Union Carbide Corp.), and IRGACURE™261, a metallocene complex salt (Ciba-Geigy).

Optionally, the hot melt compositions of the invention may further comprise a hydroxyl-containing material. The hydroxyl-containing material may be any liquid or solid organic material having hydroxyl functionality of at least 1, preferably at least 2, and most preferably about 3. The hydroxyl-containing organic material should be free of other "active hydrogen" containing groups such as amino and mercapto moieties. The hydroxyl-containing organic material should also be substantially free of groups which may be thermally or photolytically unstable so that the material will not decompose or liberate volatile components at temperatures below about 100° C. or when exposed to actinic or electron beam radiation during curing.

Preferably the organic material contains two or more primary or secondary aliphatic hydroxyl groups (i.e., the hydroxyl group is bonded directly to a non-aromatic carbon atom). The hydroxyl group may be terminally situated, or may be pendent from a polymer or copolymer. The number average equivalent weight of the hydroxyl-containing material is preferably about 31 to 2250, more preferably about 80 to 1000, and most preferably about 80 to 350.

Representative examples of suitable organic materials having a hydroxyl functionality of 1 include alkanols, monoalkyl ethers of polyoxyalkylene glycols, and monoalkyl ethers of alkylene glycols.

Representative examples of useful monomeric polyhydroxy organic materials include alkylene glycols (e.g., 1,2-ethanediol, 1,3-propanediol, 1,4-butanediol, 2-ethyl-1,6-hexanediol, bis(hydroxymethyl)cyclohexane, 1,18-dihydroxyoctadecane, and 3-chloro-1,2-propanediol), polyhydroxyalkanes (e.g., glycerine, trimethylolethane, pentaerythritol, and sorbitol) and other polyhydroxy compounds such as N,N-bis(hydroxyethyl)benzamide, 2-butene-1,4-diol, castor oil, etc.

Representative examples of useful polymeric hydroxyl-containing materials include polyoxyalkylene polyols (e.g., polyoxyethylene and polyoxypropylene glycols and triols of equivalent weight of 31 to 2250 for the diols or 80 to 350 for triols), polytetramethylene oxide glycols of varying molecular weight, hydroxyl-terminated polyesters, and hydroxyl-terminated polylactones.

Useful commercially available hydroxyl-containing materials include the POLYMEG series (available from QO Chemicals, Inc.) of polytetramethylene oxide glycols such as POLYMEG 650, 1000 and 2000; the TERATHANE series (from E.I. duPont de Nemours and Company) of polytetramethylene oxide glycols such as TERATHANE 650, 1000 and 2000; POLYTHF, a polytetramethylene oxide glycol from BASF Corp.; the BUTVAR series (available from Monsanto Chemical Company) of polyvinylacetal resins such as BUTVAR B-72A, B-73, B-76, B-90 and B-98; the TONE series (available from Union Carbide) of polycaprolactone polyols such as TONE 0200, 0210, 0230, 0240, and 0260; the DESMOPHEN series (available from Miles Inc.) of saturated polyester polyols such as DESMOPHEN 2000, 2500, 2501, 2001KS, 2502, 2505, 1700, 1800, and 2504; the RUCOFLEX series (available from Ruco Corp.) of saturated polyester polyols such as S-107, S-109, S-1011 and S-1014; VORANOL 234-630 (a trimethylol propane) from Dow Chemical Company; VORANOL 230-238 (a glycerol polypropylene oxide adduct) from Dow Chemical Company; the SYNFAC series (from Milliken Chemical) of polyoxyalkylated bisphenol A's such as SYNFAC 8009, 773240, 8024, 8027, 8026, and 8031; and the ARCOL series (from Arco Chemical Co.) of polyoxypropylene polyols such as ARCOL 425, 1025, 2025, 42, 112, 168, and 240.

The amount of hydroxyl-containing organic material used in the compositions of the invention may vary over a broad range, depending on factors such as the compatibility of the hydroxyl-containing material with both the epoxy-containing material and the polyester component, the equivalent weight and functionality of the hydroxyl-containing material, and the physical properties desired in the final cured composition.

The optional hydroxyl-containing material is particularly useful in tailoring the flexibility of the hot melt compositions of the invention. As the equivalent weight of the hydroxyl-containing material increases, the flexibility of the hot melt composition correspondingly increases although there may be a consequent loss in cohesive strength. Similarly, decreasing equivalent weight may result in a loss of flexibility with a consequent increase in cohesive strength. Thus, the equivalent weight of the hydroxyl-containing material is selected so as to balance these two properties, the appropriate balance depending on the particular application.

Flexible melt sealing compositions are useful in forming flexible sheets for sealing performance at lower temperatures, i.e., below about 0° C. If the hydroxyl-containing material is used to tailor the flexibility of the melt sealing composition, polyoxyethylene glycols and triols having an equivalent weight of about 31 to 2250 for the glycols and 80 to 350 for the triols are particularly preferred. Even more preferred are polyoxypropylene glycols and triols having an equivalent weight of about 31 to 2250 for the glycols and an equivalent weight of about 80 to 350 for the triols.

The melt-flowable compositions of the invention comprise from 0.01 to 95 parts per 100 parts total of the epoxy-containing material and, correspondingly, from 99.99 to 5 parts of the polyester component. More preferably, the melt-flowable compositions of the invention comprise from 0.1 to 80 parts of the epoxy-containing material and, correspondingly, from 99.9 to 20 parts of the polyester component. Most preferably, the hot melt compositions of the invention comprise from 0.5 to 60 parts of the epoxy-containing material, and, correspondingly, from 99.5 to 40 parts of the polyester component. Increasing amounts of the epoxy-containing material relative to the polyester component generally result in melt-flowable compositions having higher ultimate strength and heat resistance but less flexibility, and lower viscosity. Increasing amounts of the polyester component generally result in melt-flowable compositions having lower ultimate strength, heat resistance and higher viscosity but greater flexibility and green strength build-up. Thus, the relative amounts of these two ingredients are balanced depending on the properties sought in the final composition.

The photoinitiator, if used, is included in an amount ranging from about 0.01 to 4% based on the combined weight of the epoxy-containing material and the polyester component. Increasing amounts of the photoinitiator can result in an accelerated curing rate. Increased amounts of photoinitiator can also result in reduced energy exposure requirements. The amount of the photoinitiator is determined by the rate at which the composition should cure, the intensity of the radiation source, and the thickness of the composition.

Figure 1B:
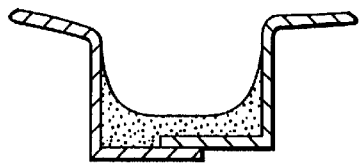
FIG. 1b is a cross-sectional view showing the sheet material shown in FIG. 1a after heating.
Figure 2:
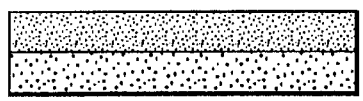
FIG. 2 is a cross-sectional view of a two-layer sheet material according to the invention.
Figure 3A:
FIG. 3a is a cross-sectional view of another two-layer sheet material according to the invention.
Figure 3B:
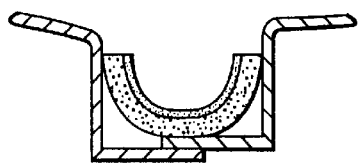
FIG. 3b is a cross-sectional view showing the sheet material of FIG. 3a situated in an automobile roof ditch prior to heating.
Figure 3C:
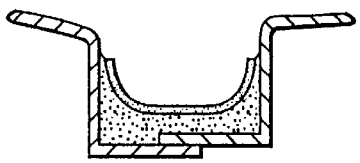
FIG. 3c is a cross-sectional view showing the sheet material of FIG. 3a situated in an automobile roof ditch after heating.
Figure 4A:
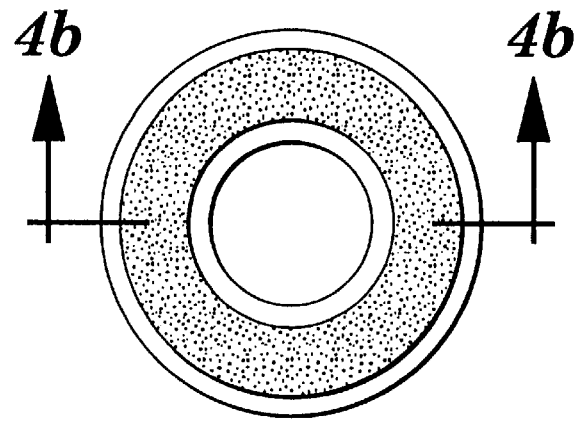
FIG. 4a is a top view of a washer having a sheet material of the invention adhered thereto.
Figure 4B:
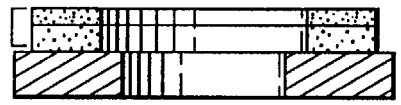
Figure 4C:
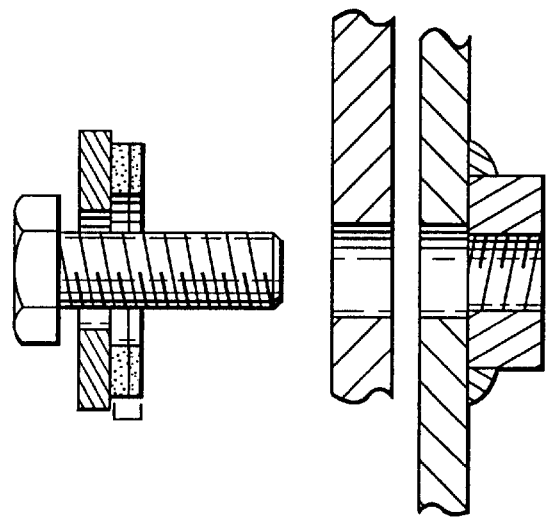
FIG. 4c is a sectional view showing the embodiment of FIG. 4a having a bolt inserted therein for joining a door hinge to a door frame.

In some applications, it is useful to initially radiation cure the melt-flowable composition only at the surface of the sheet, and subsequently thermally cure the entire sheet later. For example, an actinic radiation curable epoxy polyester sheet material is exposed to actinic radiation to cure the surface of the sheet material, and then placed in the aforementioned roof ditch such that the sheet material forms a concave surface along the roof ditch as shown in FIG. 1b. The strip is then heated to a temperature sufficient to bond the strip to the surfaces within the ditch, and cure the entire thickness of the sheet. The result is a skinned surface on the sheet material that aids in providing a smooth surface for visual and functional reasons.

Melt-flowable compositions which include a polyether polyol may be useful in allowing the melt-flowable sheet to conform to the surface and displace trapped air before forming a permanent bond to the substrate.

Additionally, and optionally, up to 50% of the total volume of the composition (based on the epoxy-containing material, the polyester component, the photoinitiator and the optional hydroxyl-containing material), may be provided by various fillers, adjuvants, additives and the like such as silica, glass, clay, talc, pigments, colorants, glass beads or bubbles, glass or ceramic fibers, antioxidants, and the like so as to reduce the weight or cost of the composition, adjust viscosity, and provide additional reinforcement. Fillers and the like which are capable of absorbing the radiation used during the curing process should be used in an amount that does not adversely affect the curing process.

The melt-flowable compositions comprising the foregoing polyester and epoxy polyester materials are prepared by mixing the various ingredients in a suitable vessel, preferably one that is not transparent to actinic radiation if a photoinitiator is used, at an elevated temperature sufficient to liquefy the components so that they can be efficiently mixed with stirring until the components are thoroughly melt blended but without thermally degrading the materials. The components may be added simultaneously or sequentially, although it is preferred to first blend the epoxy-containing material and the polyester component followed by the addition of the hydroxyl-containing material and then the photoinitiator. The melt-flowable compositions should be compatible in the melt phase, i.e., there should be no visible gross phase separation among the components.

The melt-flowable sheet made with epoxy polyester compositions may be tacky or tack-free. A blend of liquid and solid epoxy-containing materials is useful in providing a tacky sheet.

In use, the melt-flowable sheet materials containing a photoinitiator can be exposed to a radiation source to activate the catalyst for curing of the epoxy-containing material before, during, or after the sheet material has been applied to the substrate. Activation of the catalyst occurs upon exposure of the sheet materials to any source emitting actinic radiation (i.e., radiation having a wavelength in the ultraviolet or visible spectral regions). Suitable sources of radiation include mercury, xenon, carbon arc, tungsten filament lamps, quartz halogen lamps, fluorescent lights, sunlight, etc. Exposure times must be sufficient to activate the catalyst and may vary from less than about 1 second to 20 minutes or more depending upon both the amount and the type of reactants involved, the radiation source, the distance from the radiation source, and the thickness of the sheet.

The time needed to reach fill cure may be accelerated by curing the sheet materials with heat, such as in an oven. The time and temperature of the cure will vary depending upon the glass transition temperature of the polyester component, the concentration of the photoinitiator, the radiation exposure conditions, and the like. Typical cure cycle conditions range from 5 to 30 minutes with temperatures ranging from about 50° C. to 200° C. More than one heating cycle may be used to cure the sheet materials.

The compositions may also be cured by exposure to electron beam radiation. The dosage necessary is generally from less than 1 megarad to 100 megarads or more. The rate of curing tends to increase with increasing amounts of photoinitiator at a given light exposure or irradiation. The rate of curing also increases with increased radiation intensity or electron dosage.

Other layers may be included in the melt-flowable sheet for various purposes. A second melt-flowable layer may be adhered to the one major surface of the first melt-flowable sheet to improve the topographical and aesthetic features of a surface.

Furthermore, one or more of the layers of a sheet material of the invention may include other ingredients disclosed in application U.S. Ser. No. 08/386,251, filed Feb. 9, 1995, continuation of U.S. Ser. No. 08/150,212, filed Nov. 10, 1993, both of which are hereby incorporated by reference. Examples of such ingredients are polyacetals, reinforcing copolymers, and polycaprolactone diols. Further examples include glycidyl methacrylate, silanes and other species to provide for crosslinking between separated polymeric phases.

A second layer may be included in the melt-flowable sheet material to improve outdoor weatherability of the tape.

The second layer of the melt-flowable tape can include thermal expansion agents such as blowing agents, foaming agents, expandable polymeric microspheres and the like to impart a convex shape to a surface.

A woven or nonwoven web or scrim may be included in the melt-flowable sheet material. The web can be laminated to the melt-flowable layer using an adhesive or by heat lamination techniques, and may be inserted between two melt-flowable layers. Addition of a nonwoven web has been found to be useful in controlling the flow of the melt-flowable layer. The woven or nonwoven web can also be used to impart strength to the sheet material for better handling properties.

Other materials that can be included as part of the melt-flowable sheet material are thermoplastic films. Preferably, the films are dimensionally stable at the temperatures to which they might be exposed to either in applying the melt-flowable sheet material to a substrate, e.g., when the sheet material is heated to a temperature necessary to cause flow and/or thermosetting of the sheet material, or after it has been applied, e.g., exposure to cold weather temperatures, sunlight, etc. Useful films include polyurethane films, oriented polyester films, polyimide films, polyolefin films, and the like. The films can be used to provide smooth surfaces for painting or as the finished surface after the melt-flowable sheet has been bonded to a surface.

Thermoset films can also be used. Examples of thermoset films include films made from the above-described epoxy polyester materials that have been crosslinked, cross-linked epoxy films, and the like.

Preferred films include films made from the above described epoxy polyester materials, polyester films include polyethylene terephthalate films, ultrahigh molecular weight polyethylene films, microporous ultrahigh molecular weight polyethylene films, ultrahigh molecular weight polypropylene films, ultrahigh molecular weight microporous polypropylene films, and polyimide films. Ultrahigh molecular weight polyolefin films are preferred in some embodiments because the very long chains of these polyolefins can soften upon heating without exhibiting the molten liquid flow typical of thermoplastic materials.

Useful ultrahigh molecular weight polyethylene films have an intrinsic viscosity of at least about 18 deciliters per gram (dL/g), a typical range of intrinsic viscosities between about 18 and 39 dL/g, and a preferred range between 18 and 32 dL/g. Useful ultrahigh molecular weight polypropylene films have an intrinsic viscosity of at least 6 dL/g. A typical range of intrinsic viscosities is 6 to about 18 dL/g, and a preferred range is 6 to 16 dL/g.

Both thermoset and thermoplastic films should be dimensionally stable at the temperatures to which they are exposed. By dimensionally stable, it is meant that at the films have sufficient integrity at the temperatures of use, and particularly, during the heat curing cycle of the melt sealing layer at about 120C to 200C for 20 to 40 minutes, so they do not melt and flow. Also the films do not exhibit wrinkling when they are heated to the melt sealing temperature and subsequently cooled. The films also have enough integrity to prevent entrapped air bubbles in the melt sealing layer from blowing through the film and causing a defect. Preferably, the films, after they have been laminated to a melt sealing layer and heated to the temperature needed to bond the melt sealing layer to a surface, will exhibit a downweb and crossweb shrinkage of less than about 5%, more preferably, less than about 3%, and most preferably, less than about 2%. In highly preferred embodiments, the films will exhibit less than 1% shrinkage in the downweb direction, and less than 0.5% in the crossweb direction.

Depending upon the application, it may be desirable to have a certain amount of shrinkage in the film to help control the flow of the underlying melt sealing material.

The films can contain additives to improve or impart various properties such as paint adhesion and thermal stability. Useful materials for these purposes include siliceous fillers such as silica, talc, zeolites, kaolinite, mica, alumina silica gels, glass, and the like, carbonaceous materials, inorganic metal oxides, sulfides, sulfates, and carbonates. Examples include carbon black, iron oxide, titanium oxide, zirconia, zinc sulfide, barium sulfate, calcium carbonate, and magnesium carbonate. Preferred fillers are silicas and clays, and preferred siliceous fillers are precipitated silica, silica gel, and fumed silica. Fillers can be used in amounts from about 5% to 90% by weight based on the total weight of the film.

In a preferred embodiment, the film is a microporous ultrahigh molecular weight microporous polyolefin film having 50 to 90% by weight of the total weight of the film of a siliceous fillers and a network of interconnecting pores throughout the film with the pores constituting 35 to 80 percent by volume of the film.

Useful commercially available films include microporous films sold by PPG Industries under the Teslin™ tradename, and polyester films sold by ICI Americas under the Melinex™ tradename.

Suitable microporous films are also described in U.S. Pat. No. 4,861,644 (Young et al.) and U.S. Pat. No. 4,439,256 (Shipman), both of which are hereby incorporated by reference.

The dimensionally stable film can be used alone or in combination. For example, a suitable construction could include a 0.003 inch thick polyester film as the dimensionally stable film, and having a 0.0005 inch thick film of the thermoset epoxy polyester material laminated to the polyester film. A film having good dimensional stability at a higher temperature such as polyester can also be laminated to a film having less dimensional stability at the same temperature. An example of such a construction would be a 0.001 inch thick ethylene vinyl alcohol film laminated onto the 0.003 inch thick polyethylene terephthalate film. Combination films can be formed by conventional means such as adhesively laminating the films together with, for example, a hot melt adhesive or a laminating adhesive, coextruding the films, and extrusion coating the film onto the more stable film and optionally curing the coating.

The films can be heat stabilized by conventional means to improve the thermal stability of the films. Typically such a process includes heating the film without stress at a temperature above the maximum use temperature.

The dimensionally stable film can be treated to improve adhesion of the film to either or both the melt sealing layer and a paint or primer. Such treatments can include corona treatment, flame treatment, chemical priming, chemical grafting, and the like. Treatments are especially useful for polyolefin films.

In a preferred embodiment, the dimensionally stable film is attached to a second film which can provide a surface that will readily accept standard paints and primers, such as those used in the automotive industry. Examples of such films include films made from ethylene vinyl alcohol and the above described epoxy polyester.

Two or more melt-flowable layers having different melt flow properties may be laminated together to form a melt-flowable sheet material. For example, the top layer can be formulated to have greater flow properties than the bottom layer, while the bottom layer is formulated to have higher strength for better handling properties, so that on heating, the top layer will flow and encapsulate the bottom layer.

In another embodiment, a pressure-sensitive adhesive (PSA) layer may be attached to the melt-flowable layer so that the melt-flowable sheet can be positioned on a surface before the melt flow layer is heated. The melt flow layer may either flow slightly to provide rounded edges on the melt-flowable sheet without flowing around the PSA, or it may flow sufficiently to encapsulate the PSA so that none of the PSA edges are exposed.

Useful PSA's include block copolymer PSA's, such as styrene-isoprene-styrene block copolymers that can be hot melt coated or solvent coated; acrylonitrile PSA's; acrylate PSA's, such as copolymers of acrylic or methacrylic esters of non-tertiary alcohols having from about 4 to 12 carbon atoms in the alcohol moiety and optional copolymerizable reinforcing monomers, that are polymerized using known techniques including solvent polymerization, emulsion polymerization, and radiation polymerization; natural rubber PSA's, silicone PSA's, and vinyl acetate PSA's. The PSA's can be bonded to the melt-flowable sheet by any known techniques including coating the PSA directly onto the sheet and curing the PSA or drying off the solvent, laminating the PSA transfer tape to the sheet, co-extruding a hot melt PSA with the melt-flowable layer, and the like.

In a preferred embodiment, the PSA is an acrylate copolymer. Useful esters for the copolymer include n-butyl acrylate, hexyl acrylate, 2-ethylhexyl acrylate, octyl acrylate, isooctyl acrylate, decyl acrylate, dodecyl acrylate, and mixtures thereof.

The copolymerizable reinforcing monomer, if used, is a monomer which has a homopolymer glass transition temperature higher than the glass transition temperature of a homopolymer prepared from the acrylic or methacrylic ester. Useful reinforcing monomers include acrylic acid, isobornyl acrylate, N-vinyl pyrrolidone, acrylonitrile, N-vinyl caprolactam, N-vinyl piperidine, and N,N-dimethylacrylamide, and itaconic acid.

When a reinforcing monomer is used, the acrylic or methacrylic ester will generally be present in an amount of about 50 to 100 parts by weight, and the reinforcing comonomer will be present in a corresponding amount of from about 50 to 0 parts by weight.

The above-described pressure-sensitive adhesives can be prepared by known processes by mixing an initiator such as azobisisobutyronitrile in an organic solvent such as ethyl acetate, adding the monomers in the desired proportions, and then heating at an elevated temperature such as 80° C., until the polymerization is completed. The adhesives can also be prepared by UV polymerization and E-beam polymerization by processes known in the art. Pressure-sensitive adhesives are also available commercially from a number of suppliers as adhesive transfer tapes. Such tapes include product numbers 465, 467, and 468, all commercially available from Minnesota Mining and Manufacturing Co.

In an another embodiment, the melt-flowable sheet material may include a layer of a thermosettable PSA which is tacky and pressure-sensitive at room temperature, and which cures to a thermoset adhesive after heating. This type of melt-flowable sheet material has utility in bonding together two surfaces with the sheet bonding to a first surface on the thermosettable PSA side at a lower temperature, i.e., about room temperature, and then bonding to a second surface on the melt-flowable side at a higher temperature, i.e., the melt temperature of the melt-flowable layer. When the substrates are heated at the higher temperature, the PSA also cures to form a thermoset adhesive having very high bond strengths. In this application, the melt-flowable layer may be selected for minimal flow at the higher temperatures so that the melt-flowable material does not flow out of the bond.

Preferred melt-flowable layers for this embodiment include the above-mentioned polyesters and functionalized olefinic polymers.

Suitable thermosettable PSA's include a thermosettable component and a pressure-sensitive adhesive component. The thermosettable component will generally be present in an amount of about 25 to 150 parts by weight based on 100 parts by weight of the PSA component.

Coatable compositions for the thermosettable PSA can be formed by various methods which include blending together a solvent-based PSA, a thermosettable resin, and thermosettable curatives; dissolving a pressure-sensitive elastomer, such as a nitrile butadiene rubber, in a solvent, and mixing with thermosettable resins and curatives; and blending monomers or prepolymers useful for making a PSA, such as the monomers for making the above-mentioned acrylate copolymers, with thermosettable resins and curatives, and photopolymerizing the blends.

Materials useful for the PSA component include those described above for a PSA. Preferred materials include acrylonitriles and acrylates, and especially preferred are acrylates.

The thermosetting components are thermosetting resins such as epoxy resins, urethane resins, and phenolic resins. Preferred thermosetting resins are epoxies and urethanes, and epoxies are most preferred. Useful epoxy resins are described above. The epoxy resin may be solid, liquid, or a mixture thereof, as long as the epoxy can be mixed with the PSA component. Preferred epoxies include phenolic epoxy resins, bisphenol epoxy resins, hydrogenated epoxy resins, bisphenol epoxy resins, aliphatic epoxy resins, halogenated bisphenol epoxy resins, novalac epoxies, and mixtures thereof, and most preferred epoxies include diglycidyl ethers of bisphenol A.

In a preferred embodiment, the thermosettable PSA is the photopolymerized reaction product of a composition having (i) a prepolymeric (i.e., partially polymerized to a viscous syrup typically between about 100 and 10,000 centipoises) or monomeric syrup of an acrylic or methacrylic acid ester as described above; (ii) optionally, a reinforcing comonomer as described above; (iii) an epoxy resin; (iv) a photoinitiator; and (v) a heat activatable hardener for the epoxy. The adhesives can be prepared according to the procedures found in U.S. Pat. No. 5,086,088, incorporated herein by reference.

The photoinitiators useful for polymerizing the prepolymeric or monomeric syrup may be any conventional free radical initiator activatable by, for example, ultraviolet light. An example of a suitable photoinitiator is 2,2-dimethoxy-2-phenyl acetophenone (Irgacure™ 651 available from Ciba-Geigy Corporation). The photoinitiator is used in an amount sufficient to polymerize the monomers, typically about 0.01 to 5 parts by weight per 100 parts of the prepolymeric or monomeric syrup.

The heat activatable curative is added to the composition to effect curing of the epoxy resin when heated. The hardener may be any type, but preferably, it is an amine type hardener such as dicyandiamide and polyamine salts. Suitable commercial curatives are available under the Omicure™ trademark from Omicron Chemical, and under the Ajicure™ trademark from Ajinomoto Chemical. The curative is used in an amount sufficient to cure the epoxy resin, typically, in an amount from 0.1 to 20 parts by weight, and preferably, 0.5 to 10 parts by weight per 100 parts of epoxy resin.

It is useful to further add an accelerator to the adhesive composition because the heat to which the composition is exposed may be insufficient to fully activate the curing agents to cure the epoxy resin. The accelerator allows the adhesive to cure at a lower temperature and/or for shorter periods of heat exposure. Imidazoles and urea derivatives are particularly preferred in the practice of the present invention and useful compounds include 2,4-diamino-6-(2'-methyl imidazole)-ethyl-s-triazine isocyanurate, 2-phenyl-4-benzyl-5-hydroxymethylimidazole, hexakis (imidizole) nickel phthalate, and toluene bis-dimethylurea. The accelerator may be used in an amount up to 20 parts by weight per 100 parts by weight of the epoxy resin.

In making the melt-flowable sheet with a thermosettable PSA the aforementioned solvent based compositions are coated onto a flexible web, preferably a silicone coated release liner, at the desired adhesive thickness and the solvent is removed by heating the adhesive to a temperature below the thermosetting temperature. The adhesive is then laminated to the melt-flowable sheet for further use. Alternatively, the compositions can be coated directly onto the melt-flowable sheet and dried at temperatures below the hot melt activation temperature.

In an alternative embodiment, a photopolymerized syrup composition having the above described thermosettable PSA ingredients is prepared by coating the syrup composition onto a silicone release liner and photopolymerizing in an inert atmosphere, i.e., substantially oxygen-free atmosphere, e.g., a nitrogen atmosphere, and irradiating the composition with ultraviolet light. A sufficiently inert atmosphere can be achieved by covering the coating with a second polymeric film which is substantially transparent to UV radiation, and irradiating through the film. The adhesive is then laminated to the melt-flowable layer. Alternatively, a sheet of melt-flowable layer may be used in place of either the top or the bottom release liner.

Further, a nonwoven or reinforcing scrim may be inserted between the layers or embedded within the thermoset PSA layer to provide additional strength for handling purposes.

The aforementioned melt-flowable sheet having a thermosettable PSA is particularly useful for washer bonding in assembling automobiles. The washer is prepared by laminating the washer to a piece of the thermosettable PSA that has been cut, e.g., die cut or punch pressed, to the size and shape of the washer. The cut thermosettable PSA is then laminated to the washer by hand or by robotized machinery with the melt-flowable side exposed and available for bonding at higher temperatures. Alternatively, the thermosettable PSA is bonded to a sheet of metal suitable for making washers. The melt-flowable layer of the sheet is tack-free at room temperature. Washers of the desired dimension are then stamped from the metal sheet.

In use, the washer is used to tighten a bolt to a door hinge as the door is aligned and attached to the automobile frame. The automobile is then painted and put through oven curing cycles to dry and cure the paint. The melt-flowable side of the sheet also melts sufficiently in the oven to bond aggressively to the metal surface of the frame. The doors are then removed for installing interior parts, and the doors can be re-attached in the aligned position as indicated by the position of the washers. This method of washer bonding allows for automatic dispensing of the washers in assembly as well as eliminating liners and adhesive contamination problems associated with previously known methods of bonding washers.

In the washer bonding application the melt-flowable sheet is preferably from about 10 to 250 micrometers thick, and most preferably, 25 to 100 micrometers thick. Thicknesses greater than about 250 micrometers may result in leaking of the melt-flowable material from the washer during the thermosetting operation which can affect the strength of the bond between the washer and the automobile frame. The thermosetting pressure-sensitive adhesive layer should range from about 10 to 300 micrometers, and preferably, from about 30 to 200 micrometers.

TEST PROCEDURES
OVERLAP SHEAR STRENGTH

Two 2.5 cm by 5 cm PPG ED-11 panels (electrodeposition primed steel available from Advance Coating Technologies, Inc., also referred to herein as ED-11 panels) were bonded with a 2.54 cm×1.27 cm overlap area using a strip of melt-flowable tape measuring 2.54 cm by 1.27 cm. The sample is heated to bond the two panels together at temperatures indicated in the specific examples and then cooled to room temperature for at least 16 hours. The panels are then tested in an Instron™ tensile testing machine using a crosshead speed of 5 cm per minute. The force at adhesive failure is recorded in megaPascals (MPa).

ADHESIVE SHEAR STRENGTH FOR WASHER BONDING

The adhesive shear strength was measured according to JISK6850. Two 1.6 mm thick steel panels were used as the substrates. The adhesive is placed between the panels and then cured at a temperature of 140° C. with a pressure of 500 g/cm$^2$ for 60 minutes. The panels are then cooled to room temperature before testing. Using a tensile tester, the adhesive shear strength is measured at a jaw separation rate of 50 mm/min.

The preferred adhesives have a shear strength greater than 50 kgf/cm$^2$.

PUNCHING ABILITY

A pressure operated punch press was used to punch the bonding materials in the form of a circle corresponding to the hole in a washer with a pressure of 30 kgf/cm$^2$. The number of samples per bonding material was five. The samples were assessed under the criteria below.

Good: no punching failure. The pressure-sensitive thermosetting adhesive does not leak out of the hot melt film. The cross section looks good.

Relatively hard to punch: one or two samples are punched imperfectly. The thermosetting adhesive slightly leaks out of the hot melt film.

LEAKAGE OF AN ADHESIVE AGENT

The samples used in measuring the adhesive shear strength were used to visually check for leakage of a pressure-sensitive thermosetting adhesive or the hot melt film from the steel panels. The criterion is presented below:

No leakage: Ok

Slight amount of leakage: Fair

Large amount of leakage: Poor

Specific embodiments of the invention will be illustrated by the following nonlimiting examples. Parts refer to parts by weight unless otherwise indicated.

EXAMPLES 1–2

For Example 1 (EX-1), a melt-flowable sheet was prepared by heating 100 parts of a hydroxy-functional semicrystalline polyester resin (Dynapol™1402 available from Hüls America) to about 110° C. to form a molten mixture. The molten mixture was coated on a knife bar coater (heated to 127° C.) onto a silicone coated kraft paper to form a 1.0 mm thick sheet. The sheet was cooled to room temperature and became opaque after about 2 hours indicating that crystallization had occurred.

For Example 2 (EX-2), a melt-flowable sheet was prepared by mixing 10 parts of a digylcidyl ether of bisphenol A (EPON™828, available from Shell Chemical Company) with 89 parts DYNAPOL™S1402 and 1 part triphenyl sulfonium hexafluoroantimonate (described in U.S. Pat. No. 4,321,951, column 5, line 48, to column 7, line 48), and mixing at about 110° C. for about an hour. The resulting mixture was coated on a knife bar coater (heated to 127° C.) onto a silicone coated kraft paper to form a 1.0 mm thick sheet. The sheet was cooled to room temperature.

TESTING OF EXAMPLES 1 & 2

Sample tapes of Examples 1 and 2 measuring about 2.5 cm by 7.6 cm were placed across a 2.5 cm wide strip of anodized aluminum positioned across a larger anodized aluminum panel (referred to hereinafter as a step panel), and heated in an oven at 177° C. for 30 minutes. Both tapes flowed out and provided aesthetically pleasing smooth surfaces with rounded corners and smooth transitions between the aluminum strip and the panel. The tapes also flowed out beyond the original dimensions of the strips on the panels and adhered tenaciously to the panels.

Each example was then cut into strips 1.9 cm wide and about 25.4 long and placed into U-channels having an inside width of 1.9 cm. Each U-channel was formed by bending two pieces of cold rolled steel at 90° angles and spot welding the pieces together so that a step down joint was formed in the U. The U-channels, with the strips attached, were tilted at an angle of about 15° and heated in an oven at 177° C. for 30 minutes and cooled to room temperature. Both strips had flowed out to effectively seal the joint and impart a smooth surface in the channel with no appearance of the step joint on the surface.

The lower edge of both strips were marked on the U-channel and both U-channels were then placed in a 120° C. oven at a 15° angle for 30 minutes, and then cooled. The flow from subsequent heating was about 3.2 mm on EX-1 and about 25.4 mm on EX-2.

An additional sample of each of EX-1 and EX-2 was tested on step panels as described above and heated for 30 minutes at 177° C. All four samples (the two original samples exposed to previous heating cycles and the two new samples with no exposure to subsequent heating cycles) were painted with a white water-borne base coat (HWB90934 available from PPG Industries) and heated for 5 minutes at 121° C. A two part clear coat (CNCT2AH Part A and CNCT2BE Part B, both available from PPG Industries) was mixed according to the manufacturer's instructions and spray painted on all four panels. The panels were then heated for 30 minutes at 140° C. and cooled. The paint finish on the melt-flowable strips was identical in gloss, color, and distinctness of image (which is an indication of its mirror-like qualities) as the surrounding metal surface. The paint transition between the melt-flowable strip and the metal surface was smooth and exhibited no evidence of a parting line or paint edge separation.

The samples that had been heated once to melt flow the tapes prior to painting were then placed in an oven at 120° C. for 30 minutes. After cooling, no additional flow was observed in either panel and the surface remained smooth and aesthetically pleasing. The panel with the melt-flowable strip of EX-2 exhibited slight wrinkling at the surface at oven temperatures, but the wrinkles disappeared on cooling to room temperature.

The foregoing Examples and tests illustrate preferred embodiments of the invention wherein sealed, aesthetically pleasing, and paintable surfaces are imparted to a metal surface.

EXAMPLE 3

The melt-flowable layer of EX-1 was cut into a strip measuring 2.5 cm by 7.6 cm, placed on an ED-11 panel, and heated in a 177° C. oven for 30 minutes. The panel was then cooled, painted with the white base coat and clear coat paints described above, and placed in a 121° C. oven for 30 minutes to cure the paint. The melt-flowable tape produced a protuberance having rounded edges on the panel. Subsequent heating of the panel placed horizontally in a 177° C. oven for 30 minutes did not affect the paint surface or any distortion to the protuberance. The panel was then placed in a 177° C. oven for 30 minutes at a 75° angle from the horizontal. As the panel heated, a protuberance formed into a teardrop shape with the paint surface remaining intact. The panel was cooled to room temperature in the 75° angle position and the protuberance returned to its original shape.

The same panel was reheated at a 75° angle except that a pinhole was punched through the paint layer into the melt-flowable layer. Upon heating, the underlying melt-flowable layer was still thermoplastic and oozed out of the pinhole.

The foregoing example illustrates the formation of a reacted interface between the paint and the melt-flowable sheet material.

EXAMPLE 4

A strip of the melt-flowable sheet of EX-1 measuring about 2.5 cm by 7.6 cm was placed on a silicone release coated polyester film and placed in an oven at 177° C. until the tape became clear, indicating that it had become amorphous. The strip was removed from the oven and cooled to room temperature (between 21° C. and 23° C.). The strip, still clear, had sufficient tack to adhere to an ED-11 at room temperature. The panel was then heated to adhere the strip to the panel at 120° C. for 10 minutes, and then reheated at 177° C. for 30 minutes. The sample was then painted, and cured in a 140° C. oven for 30 minutes. This example illustrates how an embodiment of the invention can be temporarily positioned on a substrate before permanently bonding to the substrate.

EXAMPLE 5

The melt-flowable sheet material of EX-1 was laminated to an acrylate PSA transfer tape (467 Adhesive Transfer Tape, available from Minnesota Mining & Manufacturing Co.). Strips measuring 2.5 cm by 7.6 cm were laminated to an anodized aluminum panel, and 2.54 cm by 1.27 cm strips were laminated to the ED-11 overlap shear panels described above. The samples were placed in an oven for 15 minutes at 177° C. and then cooled at room temperature until they were opaque (about 90 minutes).

The sample on the anodized aluminum panel adhered well and the melt-flowable sheet had encapsulated the PSA. The lap shear samples were tested and had an average overlap shear strength of 253.8 pounds per square inch. The failures were observed to be cohesive between the PSA and the melt-flowable sheet.

The above example illustrates the utility of a PSA layer on the melt-flowable sheet to hold the sheet in place until it is heated to seal a surface.

EXAMPLES 6–10

Two hydroxy-functional polyesters having different amounts of crystallinity were mixed and coated to form sheets as described in EX-1. The time required for the sheets to turn opaque was measured as an indication of the rate of crystallization. The polyester materials used were Dynapol™1402, a weakly crystalline polyester resin and Dynapol™1359, a polyester resin with higher crystallinity. The amounts of each resin are shown in Table 1. The details shown in Table 1 indicate that the rate of crystallization can be varied.

TABLE 1

|  | EX-6 | EX-7 | EX-8 | EX-9 | EX-10 |
|---|---|---|---|---|---|
| Dynapol ™S1402 | 100 | 75 | 50 | 25 | 0 |
| Dynapol ™S1359 | 0 | 25 | 50 | 75 | 100 |
| Crystallization Time (min.) | 140 | 110 | 15 | 9 | 7 |

EXAMPLES 11–18 AND C1–C3

Various thermoplastic materials were evaluated for flow and paint adhesion. The materials were provided in 1 mm to 3 mm thick sheets. Example 11 was prepared as in EX-1 except that a 1 mm thick sheet was prepared, and Example 12 was prepared as in EX-2 except with a thickness of 1 mm. The remaining sheets were prepared by placing pellets of the materials between release coated polyester liners and heating with an iron until the materials fused into sheets between about 0.08 mm and 0.15 mm in thickness. Multiple sheets were folded together to form thicker sheets measuring between about 1 and 3 mm.

The samples were placed on step panels (described above) at 177° C. for 20 minutes and the flow properties were noted.

The samples were then painted with a white water-borne base coat (HWB90934 available from PPG Industries) and heated for 5 minutes at 140° C. A two part clear coat (CNCT2AH Part A and CNCT2BE Part B, both available from PPG Industries) was mixed according to the manufacturer's instructions and spray painted on the panels. The panels were then heated for 30 minutes at 140° C. and cooled overnight. The panels were then reheated to 140° C. for 20 minutes.

The materials were tested as follows: (1) for flow after heating, but before painting (OK indicates that the material flowed but remained viscous; L indicates that the material liquified); (2) paint quality after painting, curing the paint, and re-heating (OK indicates surface appearance was good; FAIL indicates that the paint cracked or did not cure); (3) after reheating (OK indicates no change in appearance; EDGE indicates that the paint cracked around the perimeter of the sheet and FAIL indicates that the paint cracked and polymer flowed out of the cracks); and (4) for cross hatch adhesion reported as a percentage of the paint still adhered to the melt-flowable sheet, testing per ASTM D3359-90 to get (100% is desired, FAIL indicates sample failed before test could be performed). Test results are detailed in Table 2.

TABLE 2

| EX. | Melt-flowable Material | Heated 20 min. at 350° C. | Painted & Heated 30 min. @ 141° C. | Reheated 20 min. at 141° C. | Paint Adhesion % |
|---|---|---|---|---|---|
| 11 | EX-1 | OK | OK | OK | 100 |
| 12 | EX-2 | OK | OK | OK* | 100 |
| 13 | A | OK | OK | OK | 100** |
| 14 | B | OK | OK | EDGE | 100 |
| 15 | C | OK | OK | OK | 100 |
| 16 | D | OK | OK | FAIL | 100** |
| 17 | E | OK | OK | FAIL | 20 |
| 18 | F | OK | FAIL | FAIL | FAIL |
| C1 | G | L | FAIL | FAIL | FAIL |
| C2 | H | L | FAIL | FAIL | FAIL |
| C3 | I | L | FAIL | FAIL | FAIL |

A — TS-1502 available from Sherex Co.
B — BUTVAR ™B79 — polyvinylbutyral from Monsanto Co.
C — Surlyn ™1605 — ethylene acrylic acid film from DuPont Co.
D — Primacor ™3440 — ethylene acrylic acid from Dow Chemical Co.
E — Elvax ™260 — ethylene vinyl acetate from DuPont Co.
F — SCX 8008 — acrylic polyol from J. C. Johnson Co.
G — Carbowax ™8000 from Union Carbide
H — Carbowax ™20M from Union Carbide
I — TMP (trimethylolpropane) from Aldrich Chemical
*Paint surface wrinkled when hot; surface smoothed out on cooling
**Paint film was brittle

EXAMPLES 19–21

Example 19 is a melt-flowable sheet made as in EX-1 except to a thickness of about 2 mm. Example 20 was prepared using two sheets prepared as in EX-1 to a thickness of 1.27 mm with a nylon nonwoven between the two sheets. The nonwoven was a 0.3 ounce/square yard (CEREXT™ available from Fiberweb N.A.) and was laminated to the first sheet between two silicone coated polyester release liners with a heated iron. The second sheet was then laminated in a similar manner. The sheets had turned transparent during the lamination process. Example 21 was prepared as Example 20 except that a polyester nonwoven material (0.5 oz/sq. yd. Reemay 2250, available from Reemay) was used.

Examples 19–21 were tested by cutting 2.54 cm by 20.3 cm strips and placed lengthwise on a curved metal surface that was formed by bending a ED-11 primed metal panel such that it swept at an angle starting at about 30° from the horizontal. The bent panel was placed in an oven at 177° C. for 10 minutes. After cooling, Example 19 was observed to have significant flow down the sides of the panel. Example 20 had a slight amount of flow but had shrunk about 8% due to shrinkage of the nylon. Example 21 also had a slight amount of flow but no shrinkage.

The foregoing examples illustrate how a nonwoven scrim can be used to control the flow of the melt-flowable sheet.

EXAMPLES 22 And 23

Figure 5A:
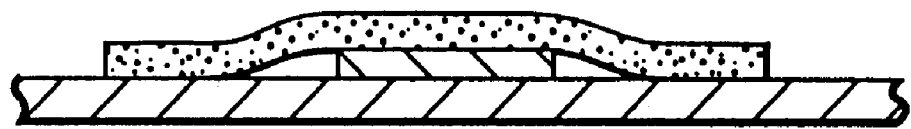
FIGS. 5a and 5b are referred to in Examples 22 and 23.
Figure 5B:
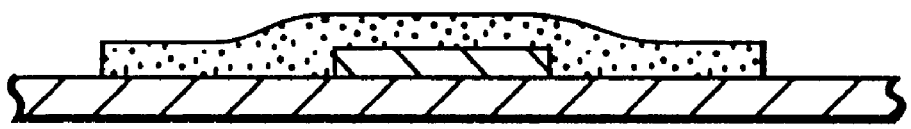

Sheets were prepared as in EX-2 to a thickness of 0.076 mm. The sheet for Example 22 was exposed to UV radiation (low intensity black light) for 5 minutes. The sheets for each example were then cut and layered to make 0.72 mm thick sheets. The sheets were then cut into 2.54 cm by 7.62 cm strips, draped over two overlapping metal panels, and then heated at 177° C. for 30 minutes. FIGS. 5a and 5b depict the panels and a sheet before (FIG. 5a) and after heating (FIG. 5b). The panels were cooled and both examples exhibited sufficient flow to seal the seam. Example 23, the sample that was not irradiated had a smoother profile over the step in the overlapping panels and the step in panels was more pronounced in Example 22. The panels were then coated with a black base coat from BASF, cured, overcoated with a two part clear coat, and cured. Both samples painted well and cross hatch adhesion was 100%.

The above examples illustrate how irradiating the sheet material can change the surface conformability.

EXAMPLE 24

A crosslinkable melt-flowable sheet was prepared as in EX-2 except that the composition was prepared by mixing 10 parts of a cycloaliphatic epoxy (ERL-4221 available from Union Carbide) with 89 parts of a weakly crystalline saturated linear copolyester (DYNAPOL™S1402) and 1 part triphenyl sulfonium hexafluoroantimonate, and coating to a thickness of 2 mm. A second melt-flowable sheet was prepared as in EX-1 except the thickness was 2 mm. The two sheets were placed on top of each other and between silicone release coated polyester liners, and heated at 177° C. for 10 minutes to form a 4 mm thick sheet. A strip was cut to a width of about 2.54 cm and placed into a roof ditch prototype having a width of 1.25 cm and a depth of about 1.9 cm, with the cross-linkable sheet on top. The prototype with the strip was placed in an oven at 177° C. for 20 minutes. After cooling, the strip had maintained an aesthetically pleasing concave surface along the length of the prototype. The bottom layer had melted and flowed into the joint in the prototype and the sides of the tape had bonded tenaciously to the sides of the ditch to effectively seal the ditch. Some entrapped air bubbles were seen and these may have been related to the thickness of the tape.

EXAMPLE 25

The 2 mm thick crosslinkable melt-flowable sheet of Example 24 was exposed to UV black light for 20 seconds to photolyze the surface with a total energy of 160 mJ/cm$^2$ (millijoules per square centimeter) using a Uvirad radiometer (Model No. VR365CH3) from E.I.T. (Electronics Instrumentation & Technology, Inc., Sterling, Va.). A strip was cut as in example 24, creased lengthwise with the photolyzed side in, and then placed into a prototype roof ditch as described in Example 24, with the photolyzed side up. The prototype was then heated at 177° C. for 20 minutes. The thinner strip provided a smoother transition line between the strip and the sides of the roof ditch prototype, while providing a tenacious bond to the sides of the prototype. Some entrapped air was observed between the strip and the prototype, but bubbles did not affect the aesthetically pleasing surface characteristics of the strip.

EXAMPLES 26–34

Melt-flowable sheets were prepared as described in EX-2 except that the compositions and materials were changed as shown in Table 3. Examples 26–31 were 2 mm thick and Examples 32–34 were 1 mm thick. All of the examples exhibited good flow properties and paint adhesion was 100% for all of the samples.

TABLE 3

| | | Melt-flowable Compositions | | | | |
| | | Epoxy | | | Catalyst | |
| EX | PET | 1 | 2 | 3 | 1 | 2 |
| --- | --- | --- | --- | --- | --- | --- |
| 26 | 94 | 5 | | | 1 | |
| 27 | 96 | 3 | | | 1 | |
| 28 | 89 | 10 | | | 1 | |
| 29 | 94 | | 5 | | 1 | |
| 30 | 96 | | 3 | | 1 | |
| 31 | 89 | | 10 | | 1 | |
| 32 | 89 | | | 10 | | 1 |
| 33 | 94 | | | 5 | | 1 |
| 34 | 96 | | | 3 | | 1 |

PET — Dynapol ™S1402
Epoxy 1 — diglycidyl ether oligomer of bisphenol-A (Epon ™1001, available from Shell Chemical Co.)
Epoxy 2 — Epon ™1002
Epoxy 3 — diglycidyl ether of bisphenol-A(Epon ™828, available from Shell Chemical Co.)
Catalyst 1 — triphenyl sulfonium hexafluoroantimonate
Catalyst 2 — described in U.S. Pat. No. 5,089,536
(eta$^6$-xylenes (mixed isomers))(eta$^5$ cyclopentadienyl) iron (1+) hexafluoroanimonate.

EXAMPLE 35

A 0.254 mm thick melt-flowable sheet was prepared as in Example 1. The second layer was prepared as follows:

A 50/50 mixture of butyl acrylate and N-vinyl caprolactam was mixed to form a solution. A melt-flowable composition (57.7% acrylate and 42.3% epoxy) was prepared by mixing 75 parts of butyl acrylate, 75 parts of the butylacrylate/N-vinyl caprolactam solution, 50 parts of a butyl methacrylate/methyl methacrylate copolymer (Acryloid™B-60, available from Rohm and Haas, Co.) and 110 parts of a diglycidyl ether oligomer of bisphenol-A (Epon™1001) in a jar on a roller mill until the epoxy and copolymer were in solution. To the solution were added 0.15 part of 2,2-dimethoxy-2-phenyl acetophenone (Irgacure™651, available from Ciba-Geigy), 0.15 part antioxidant (Irganox™1010, available from Ciba-Geigy), 1.0 part carbon tetrabromide, 3.86 parts dicyandiamide (DYHARD™100, available from SKW Chemical), 1.38 parts hexakis (imidizole)nickel phthalate, 2 parts glass bubbles (C 15-250 Glass Bubbles available from Minnesota Mining and Manufacturing Co.), and 7 parts of silica (Cab-o-sil™M-5, available from Cabot Corp.). The composition was mixed with a high shear mixer and then mixed on a roller mill for about 24 hours. The composition was then degassed and knife coated to a thickness of about 2.0 mm between 0.05 mm thick polyester liners which had been silicone coated. The coated composition was then exposed to ultraviolet light sources having 90% of the emissions between 300 and 400 nm with a maximum at 351 nm. The light intensity above the web was 1.88 mW/cm$^2$ (milliwatts/square centimeter) and 1.29 mW/cm$^2$. The total energy used was 653.8 millijoules. The resulting melt-flowable tape was substantially tack-free at room temperature (about 21° C.).

One of the polyester liners was removed from each of the sheets, and the first and second melt-flowable sheets were laminated together with an iron set at about 65.6° C. to form a melt-flowable composite sheet.

A strip of the composite sheet was placed on a metal panel having a slight depression on the surface with the first layer of the sheet on the metal surface, heated to 177° C. for 30 minutes, and then cooled to room temperature. Example 38 showed no surface defects from the depression. As a comparison, a sheet having only the second layer described above was tested in the same manner. The surface of the second sheet had a visible crater in the sheet overlaying the depression.

EXAMPLE 36

A melt-flowable sheet was prepared by extruding a 0.076 mm thick layer of an ethylene acrylic acid having a 9% acrylic acid content (PRIMACOR 3440, available from Dow Chemical Co.) on a flat T die set at about 250° C.

A 50/50 mixture of butyl acrylate and N-vinyl caprolactam was heated to about 50° C. to form a solution. A melt-flowable composition (50% acrylate and 50% epoxy) was prepared by mixing 120 parts of butyl acrylate, 80 parts of the butylacrylate/N-vinyl caprolactam solution, 50 parts of a butyl methacrylate/methyl methacrylate copolymer (Acryloid™B-60, available from Rohm and Haas, Co.) and 200 parts of a diglycidyl ether oligomer of bisphenol-A (Epon™1001, available from Shell Chemical Co.) in a jar on a roller mill until the epoxy and copolymer were in solution. To the solution was added 0.2 part of 2,2-dimethoxy-2-phenyl acetophenone (KB-1, available from Sartomer), 0.2 part anti-oxidant (Irganox™1010, available from Ciba-Geigy), 0.8 part carbon tetrabromide, 7.0 parts dicyandiamide (DYHARD™100, available from SKW Chemical), 3.0 parts hexakis (imidizole)nickel phthalate, 4 parts glass bubbles (C15-250 Glass Bubbles, available from Minnesota Mining and Manufacturing Co.) and 14 parts of silica (Cab-o-sil™M-5 available from Cabot Corp.) to form a mixture. The mixture was mixed, coated, and cured according to the procedure of Example 38 to form a melt-flowable tape.

An adhesive composite was prepared by laminating the hot melt adhesive layer to the thermosettable melt-flowable tape with an iron as described above.

EXAMPLE 37

A pressure-sensitive adhesive composition was prepared by mixing 76 parts of butyl acrylate, 24 parts N-vinyl pyrrolidone, and 0.04 parts Irgacure™651 photoinitiator (2,2-dimethoxy-2-phenyl acetophenone available from Ciba Geigy) and photopolymerizing with an ultraviolet (UV) light source under a constant nitrogen purge to form a syrup having a viscosity of about 2000 cps. With constant mixing, the following materials were added to 100 parts of the acrylate syrup and mixed for about two hours: 0.1 parts Irgacure™651, 40 parts diglycidyl ether oligomer of bisphenol-A (Epikote™1001 available from Shell Chemical Co.), 50 parts diglycidyl ether of bisphenol A (ELA 128 available from Shell Chemical Co.), 6.0 parts dicyandiamide (CG1200 from Omicron Chemical Co.), 3.5 parts 2,4-diamino-6-[2'-methylimidazolyl-(1')]-ethyl-S-triazine isocyanurate adduct (2MA-OK available from Shikoku Chemical Co., Ltd.), 5.0 parts fumed silica (Aerosil™972 available from DeGussa), and 0.03 parts of hexanediol diacrylate. The mixture was then degassed, and knife coated to a thickness of 0.3 ounces per square yard on top a polyamide nonwoven (CEREX from Fiberweb N.A.) placed on top of a transparent silicone coated polyester release liner having a thickness of about 0.05 mm. A similar release liner was placed on top of the coated composite, and the coated mixture was photopolymerized with ultraviolet lamps at an average intensity of about 1.1 mW/cm$^2$ above and below the web, such that a total energy of 500 mJ/cm$^2$ were used. The lamps used had about 90% of the emission between 300 and 400 nm, with a maximum at 351 nm. The resulting thermosetting pressure-sensitive adhesive tape (TPSA) layer had a thickness of about 0.3 mm.

A hot melt adhesive layer (HMA) was prepared by extruding an ethylene acrylic acid polymer having an acrylic acid content of 6.5% (PRIMACOR™3330, available from Dow Chemical, Ltd.) at a temperature of about 250° C. using a T die. The thickness of the layer was 50 micrometers.

An adhesive tape composite was prepared by removing one of the liners from the pressure-sensitive adhesive tape and laminating the hot melt adhesive layer to it. The composite was tested for adhesive shear strength, punching ability, and leakage. Test results are shown in Table 4.

EXAMPLE 38

A thermosetting pressure-sensitive adhesive was prepared by dissolving 150 grams of an acrylonitrile rubber (Nippol 1001 available from Nippon Zeon Co., Ltd.) in 400 grams of methyl ethyl ketone. The following materials were then added to the solution and mixed for 24 hours to obtain a homogeneous mixture: 100 grams of Epikote™828, 100 grams Epikote™1001, 20 grams dicyandiamide, 235 grams Amicure PN (epoxy curative available from Ajinomoto Co., Inc.), and 20 grams of silica powder (Aerosil™A-200 available from Nippon Aerosil Co., Ltd.). The mixture was then knife coated on a silicone coated polyester liner, and dried for 15 minutes at 70° C. The resulting thermosettable pressure-sensitive adhesive layer had a thickness of 100 micrometers.

An adhesive composite was prepared by laminating the thermosettable pressure-sensitive adhesive layer to a 50 micrometer hot melt adhesive layer prepared as described in Example 37. Test results are shown in Table 4.

EXAMPLES 39–42

Adhesive composites were prepared as described in Example 38 having varying thicknesses of each layer as shown in Table 4. Test results are also shown.

TABLE 4

| EX | TPSA Thickness Micrometers | HMA Thickness Micrometers | Shear Strength kg/cm² | Punching ability | Leakage of Bonding Material |
|---|---|---|---|---|---|
| 37 | 300 | 50 | Not tested | OK | OK |
| 38 | 100 | 50 | 162 | OK | OK |
| 39 | 100 | 100 | 175 | OK | OK |
| 40 | 100 | 200 | 166 | OK | OK |
| 41 | 50 | 100 | 164 | OK | OK |
| 42 | 360 | 50 | Not tested | Not tested | Not tested |

EXAMPLES 43–46

The thermosetting pressure-sensitive adhesives of Example 37 were laminated onto various hot melt adhesive layers as shown in Table 5. The thermosetting pressure-sensitive adhesive layer was 100 micrometers thick. The hot melt adhesive layers were prepared by extruding the hot melt adhesive resins shown in Table 5. Test results are shown in Table 6.

TABLE 5

| EX | Resin Type | Product Designation/Manufacturer | Melting Point - (° C.) | Thickness - micrometers |
|---|---|---|---|---|
| 43 | Olefinic | DAF-899/Dow Chemical, Ltd. | 83 | 75 |
| 44 | Olefinic | 8930/Toray Synthetic Film Corp. | 90 | 50 |
| 45 | Polyester | 4152B/Toray Synthetic Film Corp. | 120 | 65 |
| 46 | Polyester | 1152B/Toray Synthetic Film Corp. | 80 | 65 |

TABLE 6

| EX | Shear Strength - kg/cm2 | Punching Ability | Leakage of Bonding Material |
|---|---|---|---|
| 43 | 170 | OK | OK |
| 44 | 90 | OK | OK |
| 45 | 165 | OK | OK |
| 46 | 174 | OK | OK |

EXAMPLE 47

A first radiation curable epoxy polyester composition was prepared by blending 88.9 parts by weight of a hydroxy-functional semi-crystalline polyester resin (Dynapol™S1359 available from Huls America) and 1 part microcrystalline wax (Unilin™700 available from Petrolite Corp.). A liquid mixture having 10 parts epoxy resin (Epon™828), and 1 part triphenyl sulfonium hexafluoroantimonate was pumped into the extruder at about the midpoint of the barrel and mixed with the polyester resin mixture. A vacuum of less than 25 inches Hg was applied in the extruder barrel at the same area in the extruder barrel to eliminate air from the mixture. The extruder barrel temperatures ranged from 65C to 110C with the feed port temperature at about 25C. The flat die was maintained at a temperature of 82C. The extrudate was coated onto an untreated 0.00291 inch thick polyester film, and the coated film was wound into a roll after cooling. The extrudate thickness ranged from 0.0005 to 0.0007 inch.

The coating on the polyester film was then exposed to an ultraviolet light (UV) processor (Model QC250244ANIR supplied by Aetek International, Plainfield Ill.) with one medium pressure UV lamp having an energy output of 0.201 J/cm² at a line speed of 30 feet per minute. The resulting coating on the polyester film was thermoset and had excellent adhesion to the polyester film.

The other surface of the polyester film was then coated with a second epoxy polyester composition prepared in the same manner as the first epoxy polyester composition, except that the dry composition was 77.9 parts Dynapol™S1359, 1 part microcrystalline wax (Unilin™700) and the liquid mixture contained 20 parts epoxy resin (Epon™828), 1 part polyol (Voranol™230-238 Polyol available from Dow Chemical Co.), and 0.1 part Cp(xylenes)Fe⁺SbF₆⁻. The second epoxy polyester composition was coated to a thickness of 0.040 inch on the polyester film to form a sheet material.

EXAMPLE 48

The second epoxy polyester composition of Example 47 was coated to a thickness of 0.040 inch onto a 0.007 inch thick filled ultrahigh molecular weight polyolefin film (Teslin™sp 700 available from PPG Industries, Inc.) to form a sheet material.

A 2.5 inch wide by 10 inch long strip of the sheet material was applied to an anodized aluminum panel and heated at 177C for 15 minutes. After cooling the crossweb shrinking was determined to be 0% and the downweb shrinkable was about 1.5%.

EXAMPLE 49

A film layer was prepared by laminating a 0.00265 inch thick polyester film (Melinex 054 primed polyester film, 2.65 mils, from ICI Films, West Chester, Pa.) to a 0.025 mm thick ethylene vinyl alcohol film having 44 mole percent ethylene (E-25 from EVAL) with a polyester/isocyanate laminating adhesive (Adcote 76T3A/Catalyst F, available from Morton) diluted to a solids content of 30% using ethyl acetate. The adhesive was applied to the ethylene vinyl alcohol film at a dry coating weight of about 32 grams per square meter using a gravure coater. The adhesive was dried at about 63C to evaporate the solvent. The polyester film was then corona treated and heat laminated to the adhesive coated side of the ethylene vinyl alcohol film using nip rollers at about 93C.

The polyester side of the film laminate was then coated with a 0.040 inch thick layer of the second epoxy polyester composition as described in Example 47.

It will be apparent to those skilled in the art that various modifications and variations can be made in the method and article of the present invention without departing from the spirit or scope of the invention. Thus, it is intended that the present invention cover the modifications and variations of this invention provided they come within the scope of the appended claims and their equivalents.

We claim:

1. A article adapted for placement on the surface of a substrate comprising:

(a) a melt-flowable composition that flows and substantially covers a desired area of the surface of the substrate when said article is heated to a temperature sufficient to cause said melt-flowable composition to flow; and (b) a dimensionally stable film for controlling the melt-flow behavior of said melt-flowable composition to substantially confine said melt-flowable composition to the desired area of the surface of the substrate when said article is heated to a temperature sufficient to cause said melt-flowable composition to flow, said dimensionally stable film having a preselected surface topography which is substantially retained when said article is heated to a temperature sufficient to cause said melt-flowable composition to flow, said dimensionally stable film having sufficient integrity such that:
(i) it does not melt and flow when heated to temperatures sufficient to cause said melt-flowable composition to melt and flow.

2. An article according to claim 1 wherein said melt-flowable composition comprises a thermoplastic composition.

3. An article according to claim 1 wherein said melt-flowable composition comprises a thermosetting composition.

4. An article according to claim 1 wherein said melt-flowable composition comprises a semi-crystalline, thermosetting composition comprising an epoxy-polyester blend.

5. An article according to claim 1 wherein said melt-flowable composition comprises a thermosetting composition comprising an epoxy-acrylate blend.

6. An article according to claim 1 wherein said melt-flowable composition comprises a first melt-flowable layer and a second melt-flowable layer in which said first melt-flowable layer flows to a greater extent than said second melt-flowable layer when said article is heated to a temperature sufficient to cause said melt-flowable composition to flow, said first melt-flowable layer being adapted for placement on the surface of the substrate.

7. An article according to claim 1 wherein said melt-flowable composition comprises a first melt-flowable layer and a second melt-flowable layer adapted for placement on the surface of the substrate in which said second melt-flowable layer flows to a greater extent than said first melt-flowable layer when said article is heated to a temperature sufficient to cause said melt-flowable composition to flow to substantially encapsulate said first melt-flowable layer.

8. An article according to claim 1 wherein said melt-flowable composition comprises a thermally activated expansion agent.

9. An article according to claim 1 wherein said melt-flowable composition comprises a photo-curable, melt-flowable layer and a thermally curable, melt-flowable layer.

10. An article according to claim 1 wherein said article is adapted for placement on the surface of a metal joint of a vehicle.

11. An article according to claim 1 wherein said article is adapted for placement on the surface of a roof ditch of a vehicle.

12. An article according to claim 1 wherein said dimensionally stable film comprises an ultra-high molecular weight polyolefin.

13. An article according to claim 1 wherein said dimensionally stable film comprises an ultra-high molecular weight microporous polyolefin.

14. An article according to claim 1 wherein said dimensionally stable film comprises an oriented polyester.

15. An article according to claim 1 wherein said dimensionally stable film comprises oriented polyethylene terephthalate.

16. An article according to claim 1 wherein said dimensionally stable film comprises a B-staged thermosetting composition.

17. An article according to claim 16 wherein said B-staged thermosetting composition comprises a B-staged epoxy-polyester blend.

18. An article according to claim 1 wherein said dimensionally stable film comprises a substantially smooth surface topography.

19. An article according to claim 1 wherein said dimensionally stable film comprises a substantially smooth, paint-receptive surface that remains substantially smooth after said article has been placed on the surface of a substrate, heated to a temperature sufficient to cause said melt-flowable composition to flow, and then cooled.

20. An article according to claim 19 wherein said dimensionally stable film comprises a substantially smooth, paint-receptive surface comprising a thermosetting epoxy-polyester blend.

21. An article according to claim 19 wherein said dimensionally stable film comprises an oriented polyester film provided on one surface with a thermosetting epoxy-polyester blend.

22. An article according to claim 19 wherein said dimensionally stable film comprises a substantially smooth, paint-receptive surface comprising an ethylene-vinyl alcohol film.

23. An article according to claim 1 wherein said dimensionally stable film exhibits a downweb and crossweb shrinkage of less than about 5% when heated at a temperature sufficient to cause said melt-flowable composition to flow.

24. An article according to claim 1 wherein said dimensionally stable film exhibits a downweb and crossweb shrinkage of less than about 2% when heated to a temperature sufficient to cause said melt-flowable composition to flow.

25. An article according to claim 1 wherein said dimensionally stable film exhibits a downweb shrinkage of less than about 1% and a crossweb shrinkage of less than about 0.5% when heated to a temperature sufficient to cause said melt-flowable composition to flow.

26. An article according to claim 1 wherein said melt-flowable composition comprises a plurality of melt-flowable layers in which the melt-flowable properties of the individual layers are tailored such that said layers cooperate with each other to achieve the desired coverage of said surfaces.

* * * * *

UNITED STATES PATENT AND TRADEMARK OFFICE
CERTIFICATE OF CORRECTION

PATENT NO.    : 6,030,701  
DATED         : February 29, 2000  
INVENTOR(S)   : Michael A. Johnson et al.

Page 1 of 1

It is certified that error appears in the above-identified patent and that said Letters Patent is hereby corrected as shown below:

Title page, page 1,  
Under "Other Publications", second publication lited, "NEVCHEM Hydrocarbons" should read -- NEVCHEM Hydrocarbon --.  
Under "Other Publications", lasat publication listed "NEVCHEM Hydrocarbon Resins..." should be deleted, as it is a duplicate of the second publication listed.

Title page, page 2,  
Under the heading "U.S. Patent Documents", "4,613,233" should read -- 4,631,233 --.

Column 24,  
Line 57, "sufface" should read -- surface --.

Column 29,  
Line 11, "360" should read -- 300 --.

Column 30,  
Line 58, "A article" should read -- An article --.

Signed and Sealed this

Twenty-eighth Day of August, 2001

*Attest:*

NICHOLAS P. GODICI  
*Attesting Officer*    *Acting Director of the United States Patent and Trademark Office*